(12) United States Patent
Hooley

(10) Patent No.: US 6,373,955 B1
(45) Date of Patent: Apr. 16, 2002

(54) LOUDSPEAKERS

(75) Inventor: Anthony Hooley, Cambridge (GB)

(73) Assignee: 1... Limited, Cambridge (GB)

( * ) Notice: Subject to any disclaimer, the term of this patent is extended or adjusted under 35 U.S.C. 154(b) by 0 days.

(21) Appl. No.: 08/930,360

(22) PCT Filed: Mar. 27, 1996

(86) PCT No.: PCT/GB96/00736

§ 371 Date: Sep. 30, 1997

§ 102(e) Date: Sep. 30, 1997

(87) PCT Pub. No.: WO96/31086

PCT Pub. Date: Oct. 3, 1996

(30) Foreign Application Priority Data

Mar. 31, 1995 (GB) .............................................. 9506725

(51) Int. Cl.⁷ .................................................. H04R 9/06
(52) U.S. Cl. ...................................... 381/335; 381/332
(58) Field of Search ................................. 381/104, 106, 381/107, 101, 102, 332, 182, 150, 335, 386; 375/242, 247

(56) References Cited

U.S. PATENT DOCUMENTS 5,832,097 A * 11/1998 Armstrong .................. 381/106

* cited by examiner

*Primary Examiner*—Minsun Oh Harvey
(74) *Attorney, Agent, or Firm*—Synnestvedt & Lechner LLP

(57) ABSTRACT

A loudspeaker has a digital input signal port connected to a digital interpolator to increase the effective sampling rate whose output is fed to a signal delay and magnitude detector after which the short-term dynamic range of the input signal is possibly reduced before application of a unary encoder which encodes the digital input signal into a plurality of unary signals which are then differentially delayed and pulse shaped before application to a plurality of substantially identical acoustic transducers via transducer drivers whose average power drive levels may be controlled by signals derived from the magnitude detector and from a human operator to alter the sound volume produced.

24 Claims, 13 Drawing Sheets

Sound Output

Digital Delays

LOUDSPEAKERS

FIELD OF THE INVENTION

This invention relates to loudspeakers for providing sound from electrical signals which may be analogue or digital in nature.

BACKGROUND OF THE INVENTION

Conventional analogue loudspeakers rely for their operation on the motion of a diaphragm which is driven by some type of electromechanical motor, moving-coil being the most common variety, though electrostatic, piezoelectric and ionisation devices have all been tried and used. The analogue loudspeaker as a whole attempts to reproduce the desired sound by moving all or part of the diaphragm closely in synchronism with a smoothly varying analogue electrical signal which is usually interpreted as representing the instantaneous sound pressure that a listener to the loudspeaker device should hear. The inherent limitations of such analogue loudspeakers are in part related to stiffness of the diaphragm used, mass of the diaphragm, the linearity and efficiency of and power available from electromechanical motors with adequate bandwidth, and limitations on throw of the diaphragm. These and other factors combine to cause the analogue loudspeaker to operate with low efficiency and relatively high distortion levels.

With the current prevalence of high quality digital audio material available, frequently in 16-bit binary format with an inherent distortion level of close to 0.002%, it is clear that current analogue hi-fidelity loudspeaker systems operating close to the 1% distortion level (500 times worse) are now the limiting factor in audio quality when listening to reproduced sound. Recent trends in electronic equipment have also been to mininise power consumption, not only to reduce power wastage, but also to reduce equipment operating temperatures thus allowing mniniaturisation and high reliability, as well as portability, and allowing operation from small batteries. Again, the linear analogue power amplifier/loudspeaker combination operating at the 0.3% to 1% electro-acoustic efficiency level is out of step with these trends. Lastly, even though digital audio source material is now commonplace and becoming increasingly so with the advent of digital radio and television, all conventional hi-fidelity systems for the reproduction of digital source material need to contain a digital-to-analogue converter (DAC) at some point in the system, to produce analogue signals for application to the analogue loudspeaker. The DACs themselves produce further noise and distortion that adds to that already present in the system, and also add extra cost.

Attempts have been made previously to develop a digital loudspeaker design that overcomes some or all of the limitations of analogue loudspeakers mentioned above. These fall into several categories: Pseudo-digital loudspeakers comprising a digital signal processor driving a standard analogue speaker, Moving Coil Digital Loudspeakers with tapped "voice-coils"; Piezoelectric and Electrostatic drivers, where the area of the diaphragm is divided into separate regions with binary-related surface areas; and Pulse-width-modulation amplification which is really a digital amplifier technology. Most previous attempts at building a digital loudspeaker system have assumed that binary digital code was the digital signal medium, not only at the input of the device but also right through to the output transducers. This causes serious technical problems in practice.

In a signed n-bit system, the transducer used for the least significant bit (LSB) of the output operates at a power level $2^{n-2}$ times less than the most significant (non-sign) bit (MSB). Because of the necessarily mechanical nature of sound-producing devices, this wide dynamic range imposes serious design constraints on the types of devices used for LSB and MSB transducers. and thus makes matching of the devices very difficult. In a binary-weighted transducer (or transducer-array) system, there are serious transient problems caused at points where the code changes from a value with many consecutive low order zeroes or ones to the next level (up or down) where there are many consecutive low order ones or zeroes. Multiple acoustic transitions occur at this code point change which will inevitably produce considerable sound energy, even though the code change represents only a least significant bit change in signal amplitude which would be preferably nearly inaudible.

In addition to the switching transient problem outlined there is also a level error associated with such zeroes-to-ones and ones-to-zeroes code changes. This is because in a real system the transducers cannot easily be matched precisely enough that the each transducer is precisely one least significant bit greater in effective power or amplitude than the sum of all the lesser-bit transducers acting in concert.

It is not unknown for loudspeakers to have arrays of many transducers which produce pressure pulses, individually and independently fed. But in the past this has been done with binary digital signals, e.g. Stinger U.S. Pat. No. 4,515,997, which fails practically for the reasons given above. No one has done it with unary digital signals because their advantages in these respects were not foreseen. Voltage-sampled signals, not discrete-time-sampled signals, have been used to determine what instantaneous number of identical transducers, arranged in a one or two dimensional array, should be switched on as a series of voltage thresholds has been reached, e.g. Nubert, DE Patent 4343807 A1, but this does not disclose unary encoding of binary (or other) digital codes, nor does it usefully convert the voltage levels that cause triggering of the various transducers into appropriate sound pressure levels, instead triggering near-instantaneous 3-dimensional-volume changes in the transducers, or constant strokes, thus creating a series of positive and negative pressure impulses at the trigger edges rather than continuous pulses of an appropriate polarity, the end result being the production of no useful sound power. Nubert, having described the operation of his invention entirely in terms of events occurring at certain voltage levels, does also suggest that analogue signals could be converted to digital form with an ADC; however, this in itself does not necessarily suggest regular time-sampled digital signals as, e.g., flash-ADCs are capable of digitizing without regular (or in some cases, any) clock signals. There is no clear statement at all in Neuberg's disclosure as to how to achieve control of individual transducers in the case w here a digital input signal is present and in particular, no clear indication of what and how to encode such digital input signals into any required form. Neuberg also discloses the idea of using constant stroke transducers, but does not disclose constant pressure pulse transducers.

Another problem not adequately addressed by existing digital loudspeaker designs is that of transducer dynamics and appropriate drive waveforms for producing the desired acoustic sound output waveform.

Binary to unary ends are known in the prior art U.S. Pat. No. 5,313,300 (Rabile) describes a technique of synthesising such encoders for video DACs, for wide binary words from unary sub-encoders each capable of encoding less-wide binary words. The technique described uses 'tiers' of small unary encoders interconnected in something like a tree-structure, with additional gating blocks to perform the final conversion to unary. A problem exists with extending this design to larger input binary bit-widths in that the interconnection system between all the unary sub-encoders becomes complex and is not amenable to a bus-structured approach (because of its tree-like tiered or cascade nature). In addition, U.S. Pat. No. 5,313,300's design presupposes the existence of the unary subecoder blocks but nowhere describes the operation (nor truth table) of such sub-encoders and their exact nature is therefore unclear, although a truth table for an entire encoder is disclosed.

Digital Pulse Width Modulation, PWM, generators are known e.g. Kirn U.S. Pat. No. 4,773,096, which use a clock oscillator to drive a digital counter whose outputs are connected to one input of a digital magnitude comparator, to convert a series of digital input words into a series of PWM waveforms whose successive mean values approximate the values of the series of digital input words. However, such devices do not convert single digital input pulses into PWM ramp signals as per the present disclosure.

Rogers U.S. Pat. No. 5,287,531 discloses a means of reading data from a series of plug-in cards in a computer bus, by daisy chaining a series of serial input/output shift registers, SISOSR, one per card, and clocking their contents out in sequence into the controlling microprocessor. However, the amount of data retrievable from each card with this scheme is completely limited by the size of SISOSR installed on each card, and no capability to write information uniquely to each card, to store information or to control the cards, is disclosed therein. Roger's device apparently detects the number of devices on the bus by reading dummy data from the SISOSR which is injected at the end of the bus furthest from the controlling microprocessor and which data is arranged to be different from the data produced by any valid card that might be plugged into the box, and is then interpreted as such by the processor; it does not produce a distinct logic pulse on a dedicated line to indicate that the last device on the bus has been detected.

DEFINITION OF TERMS USED IN THE DISCLOSURE, CLAIMS & ABSTRACT

A unary digit can take on any of the two values 0, 1 or alternatively can be defined to take on only the single value 1, and its absence is then used to represent 0 somewhat as in Roman Numeral notation. Unary integer positional notation is similar to binary or decimal positional notation except that integer powers of one are used instead of powers of 2 or 10. As all positive integer powers of 1 are equal to 1, with a unary representation all digits have equal weight, and that weight is unity and the position of a unary digit in a unary positional notation number is irrelevant, only its value of 1 or 0, or alternatively, its presence or absence, having any significance. Thus e.g. the 4th unary digit from the right in a unary positional integer represents a factor of 1 or 0 times $1^3=1$, and the first unary digit at the right represents a factor of 1 or 0 times $1^0=1$. So, e.g.

$$11010_1 = 1\times1^4 + 1\times1^3 + 0\times1^2 + 1\times1^1 + 0\times1^0 = 1_{10} + 1_{10} + 0 + 1_{10} + 0 = 3_{10}$$

which is just the number of 1-digits in the number. Thus digit position becomes irrelevant in unary numbers. It is for this reason that the 0 is not needed since its use as place-keeper in positional notations is irrelevant in the unary case. Thus we may just as precisely write the number $11010_1$ as $111_1$ with both representations having the decimal value $3_{10}$. It is important to realize that in unary representation it is the number of one-digits that matters, not the position of the one-digits.

Terminology

There is no special name for decimal digits. It is conventional to abbreviate the phrase binary digit to bit. Similarly, it is conventional to abbreviate unary digit to unit. However, as the word unit is easily confused in this unfamiliar role with its more conventional meaning, we use the phrase unary digit.

SUMMARY OF THE INVENTION

A loudspeaker comprising a number of substantially identical transducers each arranged to convert an electrical loudspeaker-input-signal into an acoustic output, wherein each transducer is drivable independently of all of the others by discrete time-sampled digital signals representative of the sound to be produced by the loudspeaker, and wherein each of the transducers is such as to produce pressure pulses when driven by an electrical signal, so that the cumulative effect of the transducers is to produce an output sound representative of the input signal, characterized in that the signals by which each transducer is driveable are unary digital signals at a predetermined sampling rate, and the loudspeaker includes encoder means for converting a non-unary digital input signal at a predetermined sampling rate into a plurality of unary digital signals at said predetermined sampling rate and each transducer produces an approximately constant pressure pulse for the duration of a unary digital drive signal pulse.

The invention may additionally comprise pulse shaper means for converting the unary digital signals into a variety of square and non-square profile pulse signals appropriate to the type of transducers used. The transducers in a preferred embodiment are bipolar, being capable of producing positive and negative pressure changes dependent on the polarity significance of the unary signal applied.

In one preferred embodiment the transducers are arranged in a two-dimensional array. The shape of each transducer may be such that they tessellate in two dimensions, e.g. being triangular, square, rectangular or hexagonal. Gaps between the transducers may optionally be provided in this case. Alternatively the shape of each transducer may be such that the transducers do not tessellate, e.g. being circular or oval, gaps being provided between adjacent transducers. The presence of these gaps in a first array of transducers can be exploited by providing a further array of transducers behind the first array, each transducer in the second array being located behind a corresponding gap in the first array, making the arrangement three-dimensional. This process may be repeated to provide a composite transducer array with any number of layers.

As the transducer array is distributed in space, either in two or three dimensions, a listener will be distanced from the transducers by varying amounts, dependent on the position of any particular transducer in the array, with the effect that acoustic pulses emitted simultaneously by the transducers will arrive at the position of the listener at different times. This effect can be corrected by introducing a delay means for differentially delaying the input signals to the transducers in dependence upon their distance from the listener such that the acoustic pulses from all the transducers resulting from a single input signal change to the loudspeaker arrive at the position of the listener simultaneously. Further, the delay means may be adjustable to vary the delays applied dependent upon a chosen, and possibly varying, position of the listener.

The individual transducers in the invention as described above may alternatively be comprised of pairs, triplets, quadruplets or in general N-tuplets (N>=1) of independent transducer elements arranged in a two or three dimensional array, with each of the transducer elements comprising an N-tuplet being driven by the same unary signal and being positioned in the array such that the position of the centre of gravity of each N-tuplet taken as a whole lies as close as possible to the vertical or horizontal centre lines of the array, or both, and in the case of a three dimensional array as close as possible also to the front-to-back centre plane of the array, in such a way as to localise the perceived sound from the loudspeaker to as small an area near the centre of the array as possible. This technique allows the construction of a large digital loudspeaker comprised of arrays of transducers where the spatial extent of the array is comparable to the distance of the listener from the loudspeaker, whilst still producing the illusion of being a spatially small sound source with a definite location, close to the centre of the array.

The output sound produced by the array of transducers is the additive effect of the individual sounds produced by the individual transducers. No individual transducer reproduces the desired sound. In the case where the level of drive to each transducer is fixed, quieter sounds will be reproduced as a result of activation of a smaller number of transducers than louder sounds. The effect of encoding the input signal into a unary format is that an M out of N encoding is produced, where N+1 is the number of distinct levels (including zero) representable by the input signal and N is the maximum number of transducers required, and M is the instantaneous input signal level and is also the number of transducers activated by that input signal level.

Because in a unary encoded digital loudspeaker system all transducers have the same, unit, output power level or 'weight', from the point of view of resultant sound output pressure, it does not matter which particular M transducers are turned on out of the total set of N transducers, to produce an output pressure level of M/N of the maximum available. Thus a degree of flexibility is available in choosing subsets of transducers from the whole array which may be used to enhance performance in a variety of ways.

Preferably, the transducers associated with similar input signal levels are physically adjacent in the array so that a reasonably localised sound source results, particularly at low amplitudes of reproduced sound.

In order to reduce the acoustic emission of the loudspeaker in the frequency region above the limit of human hearing (ultrasonic emission), e.g. at frequencies greater than about 20 KHz, an acoustic low pass filter may be added between the output transducer array and the listening space. This may be implemented by the positioning of an appropriate quantity of material with high sound absorption in the region above 20 KHz and low sound absorption below that frequency, between the acoustic output transducers and the listening space.

Ultrasonic emission from the loudspeaker may also be reduced by increasing the digital sampling rate as much as possible. Standard digital audio material such as that available from compact discs and other common sources has a sampling rate in the 40 KHz to 50 KHz region. When reproducing a 20 KHz audio input signal with such a sampling rate, only two or three samples will occur within each cycle of the input signal. If the same sampling rate is carried through all the way to the acoustic output transducers, significant acoustic energy will be emitted below 100 KHz and smaller amounts at higher frequencies. Raising the sampling rate to e.g. 100 KHz places the lowest frequency strong supersonic emission at a significantly higher frequency and reduces its amplitude proportionately. The invention optionally includes digital interpolating means to raise the sampling rate of the input signal to the loudspeaker. In this invention the interpolation process is used to ease the acoustic filtering requirements after digital to analogue sound conversion, not the electrical filtering.

The encoder means may have a plurality of parallel outputs corresponding to the number of unary signals and the number of transducers. An alternative arrangement is for the unary signals to be compressed in time and for the encoder to have fewer outputs, in the limit a single output, means then being provided to reconstitute the unary signals as a parallel stream for application to the transducers.

Preferably, the loudspeaker assembly according to the invention includes transducer drivers connected between the encoder means and the transducers, the transducer drivers converting the unary output signals from the encoder means to appropriate current and voltage levels to drive the transducers.

Preferably the loudspeaker assembly incorporates additional pulse shaping means controlling the shape of the driving waveform to the transducers, the pulse shaping means being able to provide driving pulses deviating from the nominal square shape of a standard digital pulse. Where the transducers are such that over the range of speeds of operation appropriate to use as elements of a digital loudspeaker their dynamics are dominated by resistive or viscous drag forces, then a square drive pulse will provide approximately constant velocity operation while the pulse is on and thus an approximately square wave (constant) pulse output pressure will result. Where the transducer dynamics are such that spring-like restoring forces (compliance) dominate, generally the case with transducers operating below their resonant frequencies and with low damping, then the pulse shaping means may provide linear ramp shaped driving pulses. Where the transducer dynamics are such that inertial forces dominate, generally the case with transducers operating above their resonant frequencies and with low damping, then the pulse shaping means may provide bipolar impulse shaped driving pulses comprising a short pulse coincident with the leading edge of the input pulse and a second short pulse of reverse polarity coincident with the trailing edge of the input pulse. Where the dynamics of the transducers are composites of these three cases the pulse shaping means may provide a driving pulse waveform such as to produce essentially constant pulse output pressure for the duration of each input pulse. The pulse shaping means may provide any combination of some or all of the pulse shapes cited above and may additionally be combined directly with the transducer driving means into a composite structure. Alternatively, the pulse shaping means may be interposed between the encoder means and the transducer driver means. Another alternative is to interpose the pulse shaping means between the transducer driver means and the transducers.

In order to preserve the generally high power efficiency of digital pulse drive electronics when producing square drive pulses, the pulse shaping in one preferred embodiment of the invention is implemented using pulse width modulation (PWM) techniques wherein the effective shape of the drive pulse to the transducer is the mean-value of a rapidly changing square waveform with many cycles occurring within the duration of one unary input pulse and whose mark-space ratio is varied continuously as required in order to produce the desired effective pulse shape suited to the transducer dynamics.

In a further preferred embodiment the encoding means for producing N unary signals from n input binary (e.g.) bits, where $N=2^n-1$ or if one of the n input bits is used as a sign bit then $N=2^n-1$, is built in a modular fashion such that a number of identical encoding sub-modules are connected to a data bus carrying the complete input binary (e.g.) data words representing the electrical input signal to be reproduced as sound. The encoding sub-modules, which are each designed to encode P unary digits where P<N and where usually there would be Q such modules such that P×Q=N, are pre-programmed before activation as encoders by sending to them control signals via a control bus and programming data via the data bus or the control bus such that each of the Q sub-modules after programming is responsive to a different group of P input signal levels and encodes just that group of P input signal levels into P unary output signals. The net effect is to encode all N possible input signal levels into P×Q=N unary output signals but without the complexity of a brute-force n-bit binary (e.g.) to unary encoder, instead using Q identical modules which are easier to design and mass produce, and also easier to expand to different numbers of input signal bits n. The programing system may be made extremely simple by arranging for each of the Q encoder sub-modules to contain a flip-flop, and arranging for the control-bus connection between the modules to interconnect the Q flip-flops so as to form a serial input shift register. At programming time a single-access pulse AP is introduced to the input of the shift-register so formed after initially clearing it, and which shift register is physically distributed amongst all Q encoder sub-modules, and which is then clocked via a common clock signal present on the control bus, through the shift register one flip-flop at a time. As only one AP is introduced into the input of the flip-flop during programming, only one module can contain the AP after each clock pulse has moved it to the next stage, and therefore if the flip-flop in each module is used to activate that module for programming if and only if it contains the AP, each module may be programmed uniquely in turn by introducing programming information onto the common data bus for example, and issuing a programming pulse onto the control bus common to all modules whereupon only the module containing the AP in its flip-flop will respond to that programming instruction. Thus by shifting the AP through the Q modules one module at a time by means of the clock signal and issuing programming information after each such shift operation, the entire chain of modules may be programmed each with information specific to that module, even though the modules are logically identical and have no hardware unique address as such. This module programming technique is widely applicable to any programmable modular structure connected to a common bus and is not restricted in its use to the digital loudspeaker design presented here.

The encoding means for converting digital input in one form, e.g. binary, to unary digital output, may be simplified where the input form represents a signed quantity, by taking the sign information outside of the encoding scheme and using it together with the encoder outputs to control the transducer drivers or pulse shaping means directly to control the sign of the output signals. In the case of a binary to unary encoder with n input bits, where one of the input bits is a sign-bit, if the other n−1 bits are fed to an unsigned n−1 bit binary to unary encoder and the $2^{n-1}-1$ unary digital output signals are fed to the transducer drivers together with the input binary sign-bit, a considerable saving in circuitry results with no loss of information.

The effective amplitude of the acoustic output pulses emitted by the unary output transducers may be adjusted whilst still maintaining high efficiency by gating the transducers on and off with a high frequency signal superimposed on top of the drive signals from the unary encoder outputs and any pulse shaping circuitry, in a logical AND manner, where the mark space ratio of the high frequency signal is continuously variable from 0 to 1. This is similar to PWM but is an additional modulation to that already produced by the loudspeaker circuitry. An alternative or possibly additional way of altering the effective amplitude of emitted acoustic output pulse from the transducers is to vary the power supply voltage to the transducer driver circuitry, which again may be done with high efficiency by use of PWM techniques. Both of these techniques allow a volume control function to be incorporated into the loudspeaker whilst maintaining the highest possible signal to noise ratio as the effective attenuation of the volume control occurs right at the output end of the loudspeaker system and thus attenuates any internally generated noise equally with the signal.

The method described in the preceding paragraph may be used to reduce the number of transducers required for a unary digital loudspeaker without reducing the effective resolution of the sound output. This is preferably achieved by the incorporation in the loudspeaker assembly of power control means such as described in the previous paragraph which dynamically vary the output power of each and every transducer in dependence upon the amplitude of the input signal. The power control means may include a digital delay device capable of storing, at full input signal resolution of n bits (e.g. if the input signal is encoded in binary), at least one half cycle of the input signal at its lowest frequency, storage means for storing the maximum amplitude attained by the input signal in the time duration for which the input signal is stored in the delay device, means for selecting the p most significant consecutive input signal bits (p<=n) containing a 1 and not a 0 in the most significant bit position of that group of p bits and discounting the sign bit, for transfer to the unary encoder, and means for selecting the output power level of the transducers in dependence upon the maximum amplitude attained in the storage means, the selected power level prevailing whilst the stored input signal is read out of the digital delay device. In this manner, a digital loudspeaker capable of encoding <=p bits into unary encoded signals driving $2^P$ output transducers is able to produce a dynamic range of n bits (p<=n) whilst avoiding the extra complexity of providing the additional circuitry and transducers required by an n bit binary to unary encoder and output system.

In order to allow analogue signal sources as well as digital signal sources to be reproduced through the digital loudspeaker that is the subject of this invention, an analogue to digital converter may additionally be incorporated into the loudspeaker assembly to facilitate this function.

To provide both positive and negative pressure changes, separate positive and negative pressure transducers may be provided, or the same transducers may be driven in a bipolar manner. To reproduce silence, all transducers are turned off such that they are stationary. To produce a positive pressure the front face of the transducers is made to move outwards relative to the off-state. To produce a negative pressure the front face of the transducers is made to move inwards relative to the off state. If separate unary digit signals from the output of the binary to unary decoder represent positive and negative pressures, it is possible to either apply these signals to separate positive-pressure and negative-pressure producing transducers, or to drive individual transducers in a push-pull or bipolar manner, with a pair of unary signals driving each one. The latter scheme reduces the number of individual transducers required for a digital loudspeaker of a given resolution by a factor of two. Alternatively, the sign bit of a binary input signal may be omitted from the binary to unary encoder and separately used to control the polarity of pressure pulses from the acoustic transducers driven by the (positive) unary outputs of the encoder. This scheme similarly reduces the number of transducers required for a digital loudspeaker of a given resolution by a factor of two.

A practical digital loudspeaker of this type will require a large number of transducers. E.g. to handle an 8-bit binary input, requires the representation of 256 sound pressure levels. As level 0 requires no pressure, no transducer is required for this level. Therefore, 255 transducers (maximum) are required in this example. If the transducers are driven in a bipolar manner as described above then 128 transducers will suffice. In general, for a system handling n-bit binary input, either $2^n-1$ unipolar or $2^{n-1}$ bipolar transducers are required. Whilst it is possible to use discrete transducers for this purpose, it is possibly advantageous to use integrated multiple transducers to reduce cost and manufacturing complexity. For example, if electrostatic transducers were to be used, it would be possible to produce a large number of electrodes of equal area, each with a separate connection to separate unary digital signals, on one physical transducing device, thus producing a transducer array. If piezo-electric transducers were to be used, then one piece of piezo-electric material could be divided up into a large number of equal area regions each with its own electrodes for separate connection to distinct unary digital signals, again resulting in a transducer array. Similarly, with an electromagnetic transducer, a set of separately connected wires preferably fabricated by printed circuit technology on a common substrate each producing identical ampere-turn effects within the magnetic field of the device, and individually connected to distinct unary digital signals, would again result in a transducer array. All of these array structures could additionally be operated in a bipolar or push-pull fashion so that each transducer element of the array had separate connections to two distinct unary digital signals or a unary digital signal and a sign control bit for producing positive and negative output pressures. All such array structures have the great advantage of requiring multiple identical elements which assists with matching and simpler manufacture.

DETAILED DESCRIPTION OF THE INVENTION

The digital loudspeaker that is the subject of this invention has application in all instances where analogue loudspeakers are currently used, including reproduction of music and speech and other sounds in domestic and commercial equipment including radios, televisions, record compact disc and tape players, music centres, hi-fidelity sound systems, public address systems, sound reinforcement systems, home theatres, cinemas, theatres, background music systems, bands, portable sound reproduction equipment, in-car entertainment systems, and in miniaturised form in headphones.

The advantages of this digital loudspeaker design over existing loudspeaker designs in these applications include: higher quality and lower distortion reproduction; flatter form factor than most cabinet-enclosed analogue loudspeakers; greater stability due to digital rather than analogue electronics; elimination of requirement for separate linear power amplifier; lighter weight; greater portability; easier manufacture to consistent high quality standard; mass production techniques may be applied to the transducer array assemblies; higher efficiency and therefore lower power consumption and consequently longer operation time from battery power sources; scalable design allows balancing of required precision against cost and complexity in a uniform manner as lower distortion may be achieved simply by the addition of more components of identical precision; produces essentially zero output noise when input signal is zero (i.e. very high signal to noise ratio).

BEST MODE FOR CARRYING OUT THE INVENTION

Figure 1:
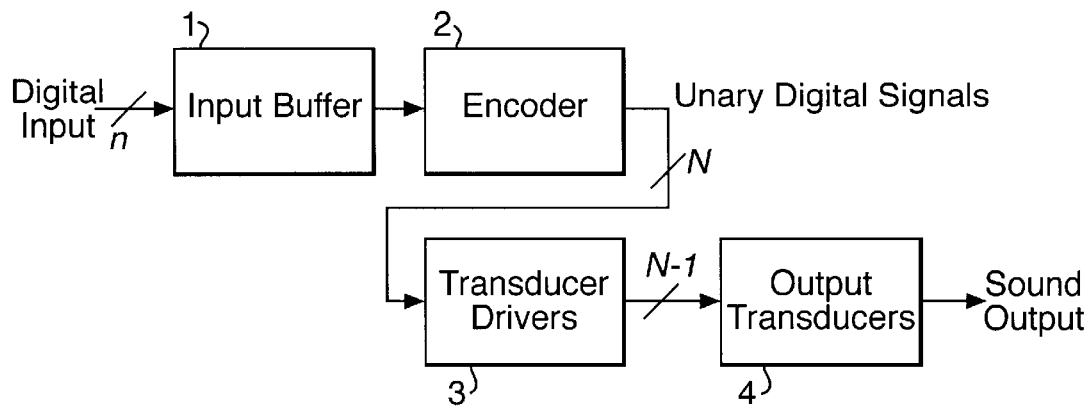
FIG. 1 is a block diagram illustrating the relationship between the various basic components of a digital loudspeaker according to the present invention.

FIG. 1 illustrates the fundamental innovation in this invention. A digital input signal of some kind representing a sound pressure waveform is received at the input buffer 1 on n input signal paths. This digital signal may be in any digital code form (e.g. binary code, decimal code, in serial or parallel format). For the purposes of explanation only, a binary code input signal of n bits, where one of the bits is a sign bit indicating the polarity of the input signal is assumed, though the invention is not in any way limited to this input format. The input buffer 1 presents a uniform impedance to the input signal(s) and performs any necessary level conversion and/or serial to parallel conversion before presenting the n parallel binary bits to the encoder 2. The encoder 2 encodes the n bit binary input code into N unary signals, one of which is a unary sign or polarity signal indicating whether the remaining N−1 unary signals represent a positive or negative quantity, and where $N=2^{n-1}$, and where the principal function of the encoding is that when the (positive) magnitude of the n-bit input signal is equal to M then M of the N−1 non-sign unary signals will be turned on (i.e. logic one) and the remainder turned off (i.e. logic 0). The N output signals including the sign signal from the encoder 2 are applied to the transducer drivers 3 which convert the N unary logic signals from the encoder 2 into N−1 sets of signals of appropriate current, voltage, pulse shape and polarity to separately drive N−1 acoustic output transducers shown collectively in FIG. 1 at 4 to which the transducer drivers 3 are connected. The N−1 sets of signals may be each a single bipolar signal with all N−1 transducers sharing a common return (not shown), or alternatively, may each be a pair of push-pull signals. The set of N−1 acoustic output transducers 4 each of which is substantially identical to the others convert the electrical drive signals into uniform acoustic pressure pulses each of amplitude a and polarity as indicated by the input sign bit. As the action of the encoder 2 is to activate M of the N−1 non-sign unary signals when the digital input signal has magnitude M, each of which results in an acoustic pressure pulse of amplitude a being emitted, the total emitted pressure amplitude from the array of transducers is M×a=A. Thus the total acoustic output pressure from the system illustrated in FIG. 1 has the same polarity as the input signal and amplitude of M×a when the digital input signal has magnitude if, and thus faithfully reproduces as sound the digital electrical input signal albeit with some quantisation noise dependent on the number of transducers N−1.

The input buffer 1 is straightforward and will not be described further. The definition of the decoding function of the unary digital encoder 2 will be illustrated for the case of an n-bit signed binary input. The encoder 2 will then have n binary inputs $b_0, b_1, b_2, \ldots b_{n-1}$, and N outputs $u_0, u_1, u_2, \ldots U_{N-1}$, where $N=2^{n-1}$. The output $u_0$ will be the unary output sign-signal indicating whether the unary output number whose magnitude is encoded in the remaining N−1 outputs is to be interpreted as positive or negative. It is defined as: $u_0=b_{n-1}$, where binary input $b_{n-1}$ is the sign-bit of the input signal. The remaining n−1 binary inputs $b_0, b_1, b_2, \ldots b_{n-2}$ represent an unsigned binary number whose magnitude V may range between 0 and $2^{n-1}-1=N-1$. The remaining N−1 unary outputs $u_1, u_2, \ldots u_{N-1}$ are defined as:

$$u_i=0 \text{ if } V<i, \text{ otherwise } u_i=1, \text{ for } 0<i<N$$

Thus if V=0 then all of the unary outputs are zero. Otherwise, there are V unary outputs with value 1 when the input binary magnitude=V, where 0<V<N.

Figure 2:
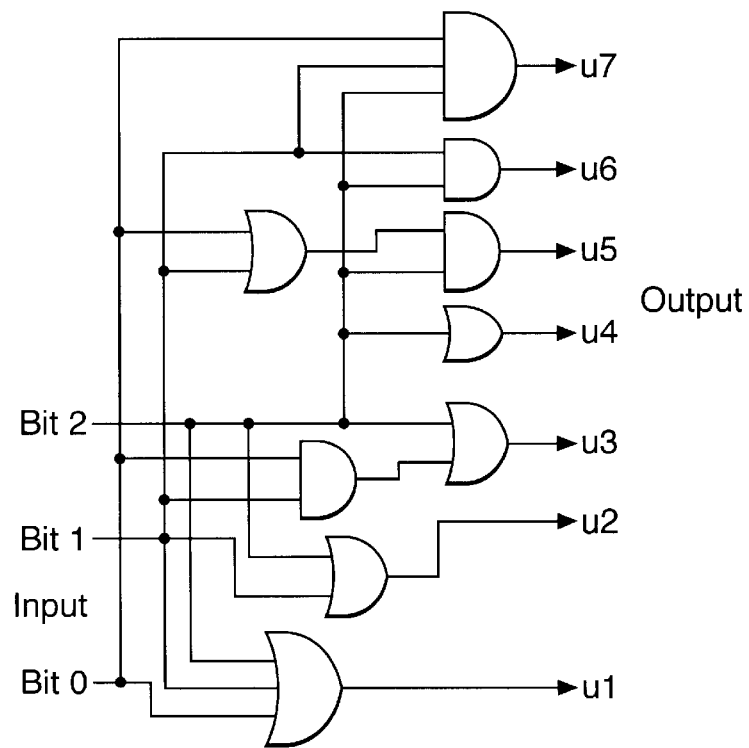
FIG. 2 illustrates logic for a unipolar 3-bit binary to unary converter.

Thus the sign bit is passed from input bit $b_{n-1}$ straight through to output unary sign bit $u_0$. The remaining circuitry essentially implements an n−1 bit unipolar binary to unary encoder. FIG. 2 illustrates a 3-bit version of a unipolar binary to unary encoder and its truth table is shown below. The decimal value of the analogue input value represented is also shown in the column labelled i/p:

| decimal | binary | | | unary outputs | | | | | | |
|---|---|---|---|---|---|---|---|---|---|---|
| i/p | bit 2 | bit 1 | bit 0 | op1 | op2 | op3 | op4 | op5 | op6 | op7 |
| 0 | 0 | 0 | 0 | 0 | 0 | 0 | 0 | 0 | 0 | 0 |
| 1 | 0 | 0 | 1 | 1 | 0 | 0 | 0 | 0 | 0 | 0 |
| 2 | 0 | 1 | 0 | 1 | 1 | 0 | 0 | 0 | 0 | 0 |
| 3 | 0 | 1 | 1 | 1 | 1 | 1 | 0 | 0 | 0 | 0 |
| 4 | 1 | 0 | 0 | 1 | 1 | 1 | 1 | 0 | 0 | 0 |
| 5 | 1 | 0 | 1 | 1 | 1 | 1 | 1 | 1 | 0 | 0 |
| 6 | 1 | 1 | 0 | 1 | 1 | 1 | 1 | 1 | 1 | 0 |
| 7 | 1 | 1 | 1 | 1 | 1 | 1 | 1 | 1 | 1 | 1 |

It should be noted that this 3-bit unary encoder is not logically equivalent to the standardly available 1-of-N encoders or decoders available in most common logic families (e.g. 74xx 138). It instead performs an M-of-N encoding with $0<M\leq N$.

Figure 3:
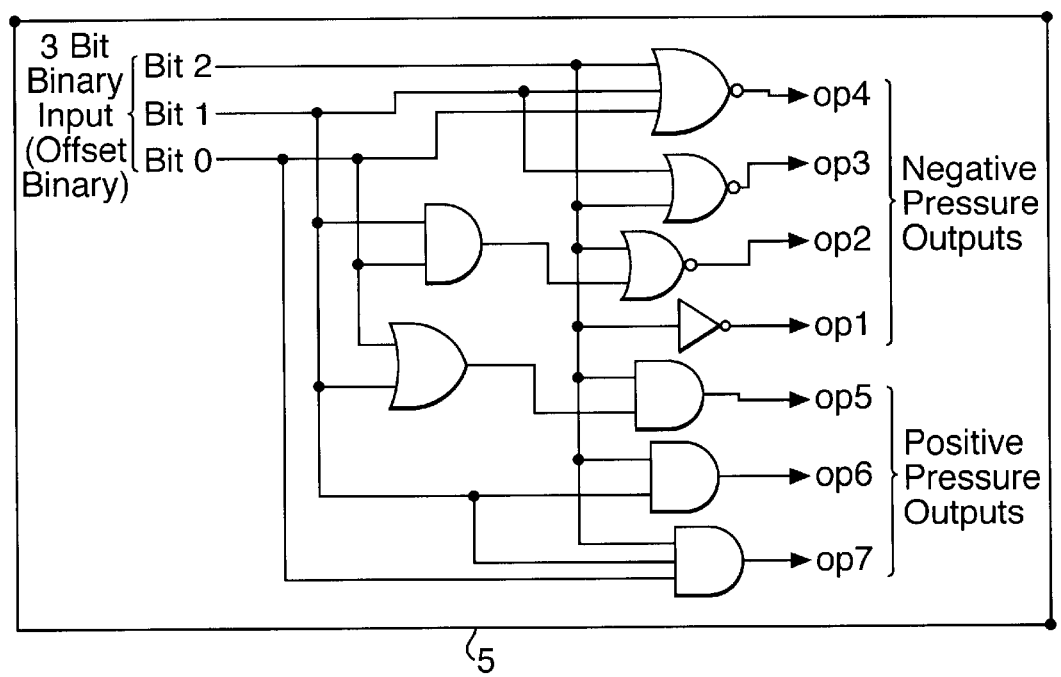
FIG. 3 illustrates simple logic for a 3-bit offset binary to unary converter.

FIG. 3 illustrates a 3-bit offset binary to unary encoder 5. In this case there is no input sign-bit as such. Instead, when the binary code is interpreted as a bipolar signal (offset binary code), one has to define the code representing zero output sound pressure. For a 3-bit offset binary system this is usually taken as code $011_2$ or $100_2$. The table below shows how this would be encoded into unary signals, some representing positive pressure outputs and some negative Pressure outputs, where we have assumed code $100_2$ represents zero.

| decimal | binary | | | negative outputs | | | positive outputs | | | |
|---|---|---|---|---|---|---|---|---|---|---|
| i/p | bit 2 | bit 1 | bit 0 | op1 | op2 | op3 | op4 | op5 | op6 | op7 |
| −4 | 0 | 0 | 0 | 1 | 1 | 1 | 1 | 0 | 0 | 0 |
| −3 | 0 | 0 | 1 | 1 | 1 | 1 | 0 | 0 | 0 | 0 |
| −2 | 0 | 1 | 0 | 1 | 1 | 0 | 0 | 0 | 0 | 0 |
| −1 | 0 | 1 | 1 | 1 | 0 | 0 | 0 | 0 | 0 | 0 |
| 0 | 1 | 0 | 0 | 0 | 0 | 0 | 0 | 0 | 0 | 0 |
| 1 | 1 | 0 | 1 | 0 | 0 | 0 | 0 | 1 | 0 | 0 |
| 2 | 1 | 1 | 0 | 0 | 0 | 0 | 0 | 1 | 1 | 0 |
| 3 | 1 | 1 | 1 | 0 | 0 | 0 | 0 | 1 | 1 | 1 |

In this truth table, i/p is given in decimal and represents a bipolar input signal level, and bits 0 to 2 are the same thing in binary. The unary digit outputs op1 to op4 will be used to drive negative pressure transducers, whilst unary digit outputs op5 to op7 will be used to drive positive pressure transducers. As can be seen from the truth table, none of the negative pressure outputs op1 to op4 are on (value 1) when any of the positive pressure outputs op5 to op7 are on (value 1). Thus if, for example, op1 was paired with op5, op2 with op6, and op3 with op7, each pair driving the opposite sides of a bipolar pressure transducer, then it will be seen that the transducers will properly produce positive or negative pressure steps according to the code in the table, without mutual interference between the positive and negative outputs. I.e. any one transducer will never be driven by a positive and a negative signal of value=1 simultaneously. Thus the number of transducers required may be approximately halved with respect to the case where each of the unary outputs is used to drive a separate transducer.

Figure 4:
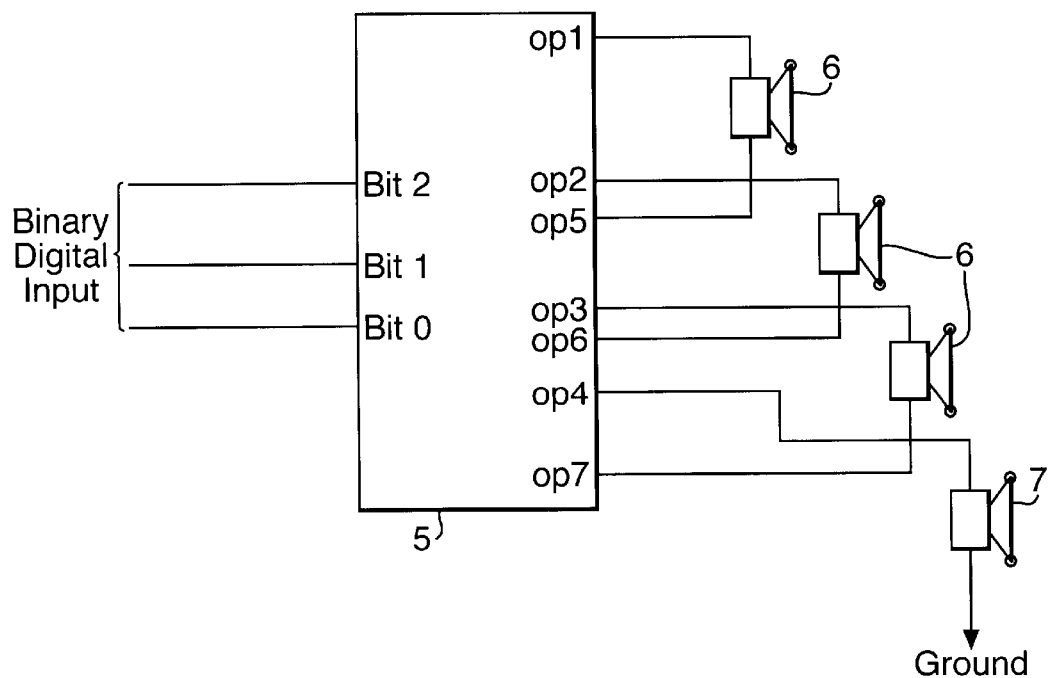
FIG. 4 illustrates a method of push-pull (bipolar) driving of transducers by pairs of unary signals of opposite polarity significance.

FIG. 4 shows how pairs of outputs from the encoder 5 can be applied to acoustic transducers 6 to provide bipolar drive and thus bipolar pressure wave outputs. As described above, op1 is paired with op5 to drive one transducer, and op2 & op6, and op3 & op7 are similarly paired. op4 can either be used for unipolar drive of an additional transducer 7, or simply not used at all, as no matching positive output signal is available to pair it with. So in general, with n-bit offset binary input, $2^n-1$ unary digital outputs will be derived by the encoder, and one of these will be unpairable, leaving $2^n-2$ unary signals. These will then be arranged into $2^{n-1}-1$ pairs and applied to the same number of audio transducers, possibly via some transducer driving circuitry.

An alternative to offset-binary is twos-complement binary. The truth table for a twos-complement to unary bipolar encoder is shown below:

| i/p | bit 2 | bit 1 | bit 0 | op1 | op2 | op3 | op4 | op5 | op6 | op7 |
|---|---|---|---|---|---|---|---|---|---|---|
| −4 | 1 | 0 | 0 | 1 | 1 | 1 | 1 | 0 | 0 | 0 |
| −3 | 1 | 0 | 1 | 1 | 1 | 1 | 0 | 0 | 0 | 0 |
| −2 | 1 | 1 | 0 | 1 | 1 | 0 | 0 | 0 | 0 | 0 |
| −1 | 1 | 1 | 1 | 1 | 0 | 0 | 0 | 0 | 0 | 0 |
| 0 | 0 | 0 | 0 | 0 | 0 | 0 | 0 | 0 | 0 | 0 |
| 1 | 0 | 0 | 1 | 0 | 0 | 0 | 0 | 1 | 0 | 0 |
| 2 | 0 | 1 | 0 | 0 | 0 | 0 | 0 | 1 | 1 | 0 |
| 3 | 0 | 1 | 1 | 0 | 0 | 0 | 0 | 1 | 1 | 1 |

In a practical digital loudspeaker, one needs to encode 8-or-more-bit binary. The complexity of the encoder then increases considerably, at least in the sense that a large number of outputs have to be produced, and the number of gates increases accordingly. Also the level of gating will increase if the individual gates themselves are to be kept as simple as possible. It should be noted that the absolute total gate delay through the encoder is usually of no consequence if it is less than ~1 msec total. Of some importance is the relative delay of the different input-to-output paths, since in an ideal encoder, all outputs would change simultaneously. Such a condition can be well approximated by keeping the level of gating between input and each output the same.

It should be noted that all of the logic circuits given above for encoders can be optimised by the standard methods. The circuits presented are for illustration only and do not attempt to minimize the number of gates used.

Figure 5:
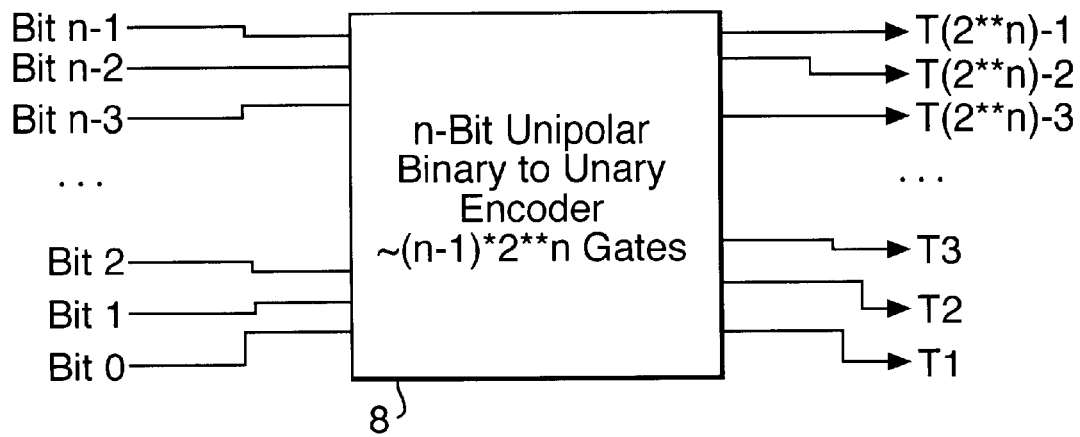
FIG. 5 illustrates the essential inputs and outputs of an n-bit unipolar binary to unary encoder with typical complexity of $\sim(n-1)2^n$ simple logic gates.
Figure 6:
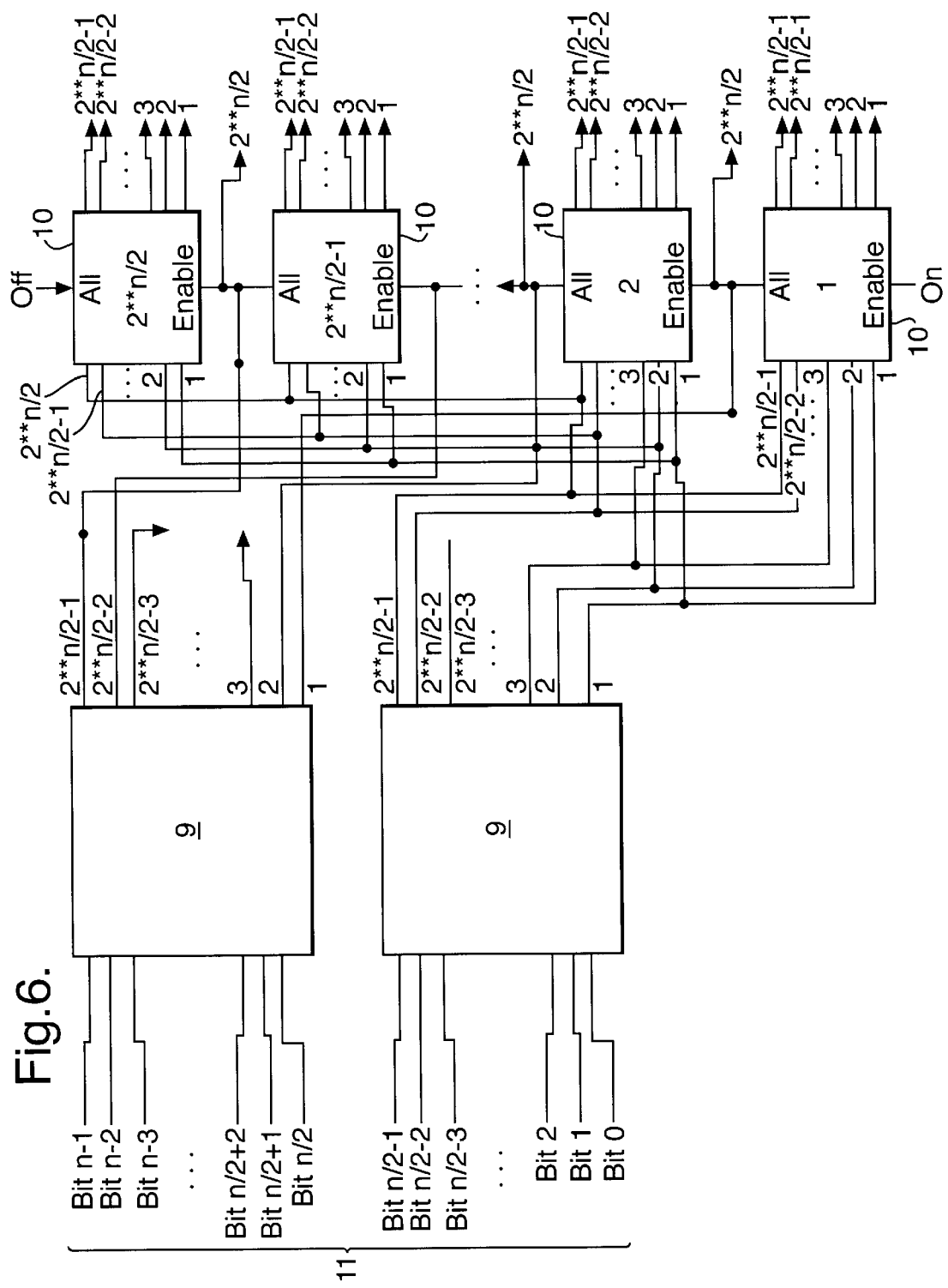
FIG. 6 illustrates a method of assembling an n-bit unipolar binary to unary encoder from two (n/2)-bit binary to unary encoders and some additional simple logic.

As the extension to a bipolar encoder is trivial, only unipolar encoders are described below. The number of simple gates in, and thus the complexity of, a brute-force unipolar binary to unary encoder (i.e. one implemented directly from the logical relations in its truth table) increases roughly exponentially with the number of bits of unipolar binary input to be encoded (number of simple gates ~(n−1)·$2^n$ for n-bit unipolar binary), and it is therefore desirable to reduce the complexity of such an encoding system. The requirements of the unipolar unary encoding scheme are that M unary outputs should be on when the digital input number represented has magnitude M. For example, FIG. 5 shows an n-bit unipolar binary-input decoder 8, where n is even. The n input signals can be thought of as 2 sets of n/2bits. The $2^n$−1 outputs together with a virtual 0 (zero) output can be thought of as $2^{n/2}$ sets of $2^{n/2}$ outputs (note that $2^{n/2} \times 2^{n/2} = 2^n$). The brute-force n-bit encoder will have order of (n−1)·$2^n$ gates. The scheme shown in FIG. 6 uses two n/2 bit encoders 9 between which the n binary bits 11 are equally divided, and a little additional simple gating in the Logic blocks 10. The logic blocks 10 in this example, of which only 4 out of a total of $2^{n/2}$ are shown, each drive $2^{n/2}$−1 unary outputs and have the same number of unary inputs, each of which turns on one output. In addition, each of the $2^{n/2}$ logic blocks 10 is provided with an ALL input, which when turned ON, turns on all the outputs of the logic block regardless of the state of any of the other inputs; in addition there is an ENABLE input, which must be turned ON if any of the unary inputs is to be able to turn on its corresponding output. The $2^{n/2}$−1 unary outputs from the upper encoder 9 are used in addition to the $2^{n/2}$−1 outputs from each of the $2^{n/2}$ logic blocks 10 in the relative positions shown in FIG. 9. Taken together this results in $$2^{n/2}-1+(2^{n/2}-1) \cdot (2^{n/2})=2^n-1$$

outputs in total as required for an n-bit unipolar binary to unary encoder. Each of the n/2 bit encoders 9 has order of (n/2−1)·$2^{n/2}$ gates if implemented in brute-force manner, so two of them will have ·(n/2−1)·$2^{n/2+1}$ gates. This can be very much less than the number of gates in a brute-force n-bit encoder. For example, if n=10 (a reasonable value for good sound quality), then (n−1)·$2^n$=9216 is the approximate number of gates for the brute-force 10-bit unary encoder, whereas (n/2−1)·$2^{n/2}$+1=4.$2^6$=256 is the approximate number of gates for the brute-force 5-bit unary encoder, a pair then requiring only 512 gates which is very much less than 9216. Thus the cost of the encoder fabricated in this manner can be much reduced as it is much simpler and uses multiples of the same device (in this example, two of the n/2 bit encoders). This decomposition scheme is not limited to the n to (n/2 times 2) scheme described here for illustration. One can split up the input bits into groups in many other ways and still realise savings in the number of gates and the overall complexity. For example, if n were a multiple of 3, then one could split the n input bits into 3 groups of n/3, (e.g. if n=12, then instead of a single encoder with order of (12−1)·$2^{12}$=45056 gates, one could use three 4-bit encoders) and in general, when n is a multiple of k, then the input bits can be split into k groups of n/k.

Figure 7:
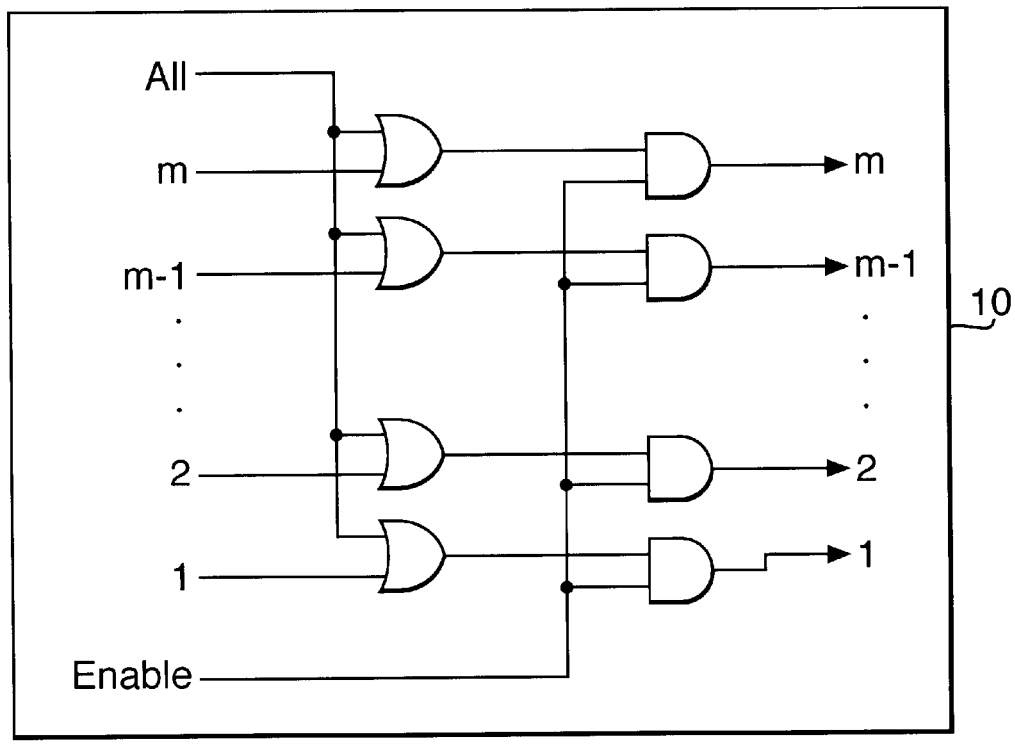
FIG. 7 illustrates details of one of the simple additional logic blocks 10 shown in FIG. 6.

FIG. 7 shows an m input logic block 10, containing extra gating to provide the ALL and the ENABLE functions. Approximately 2m simple gates are required for an m input logic block. The gating required is very simple, and because multiple such units are required (for our example above where a 10-bit binary input is decomposed into two groups of 5-bits, one would need 32 (=$2^5$) logic blocks each with 32 outputs) their unit cost is much reduced.

Figure 8:
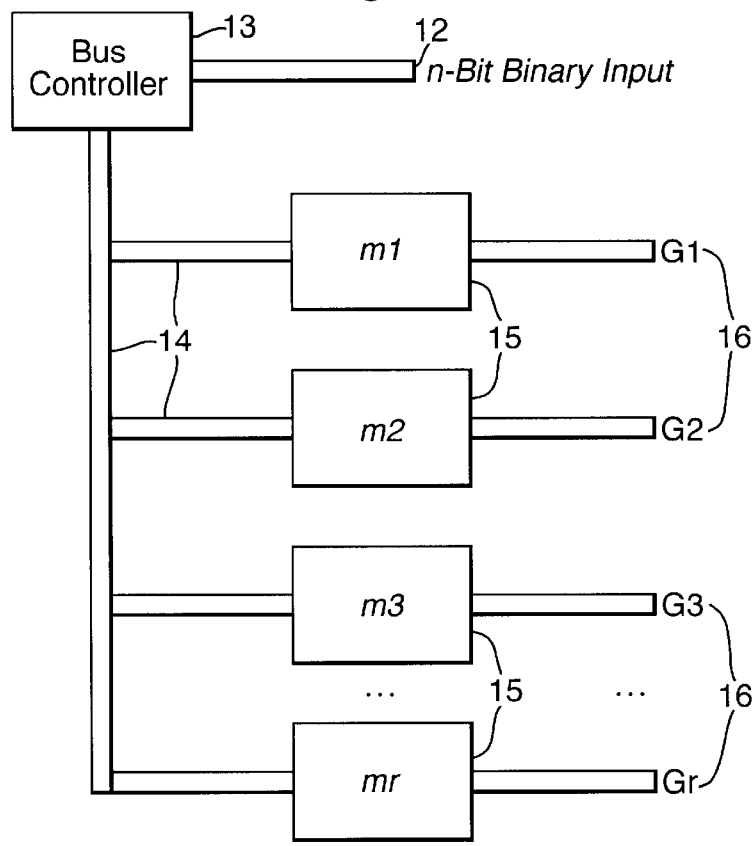
FIG. 8 illustrates a scalable and extendable bus-based binary to unary encoder constructed out of a plurality of identical logic modules connected to the bus and programmed by a bus controller.
Figure 9:
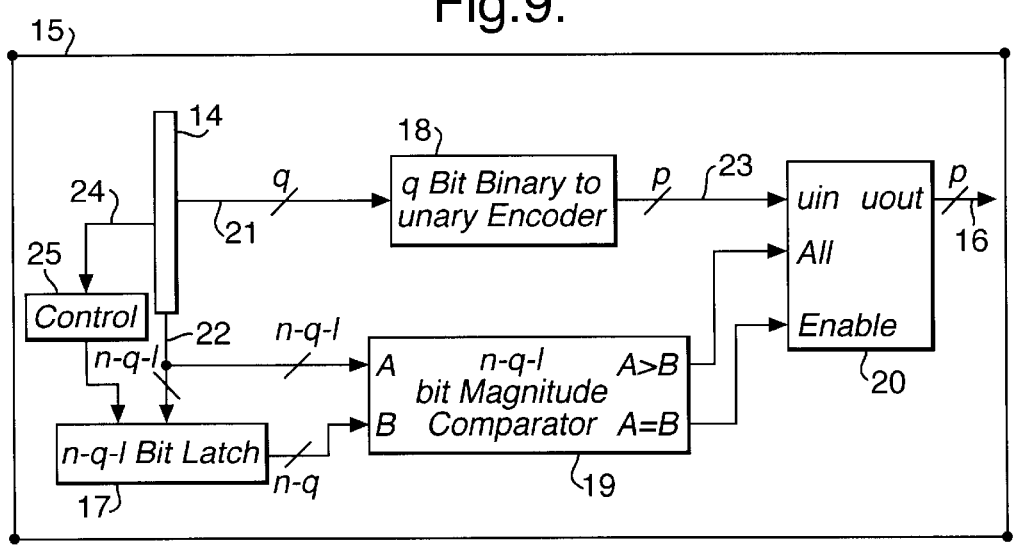
FIG. 9 illustrates in greater detail the structure of one of the bussed modules of FIG. 8, which encodes a specific range of the input signals applied to it, into unary.

A different scheme for implementing an n-bit binary to unary encoder is illustrated schematically in FIG. 8, where the n-bit binary input signal 12 is applied via the bus controller 13 to a common data and control bus 14, to which are connected a series of r identical encoder sub-modules $m_1, m_2, m_3, \ldots m_r$, shown at 15, each with p encoded unary outputs grouped as $G_1, G_2, G_3, \ldots G_r$, shown at 16. The nature of the bus structure allows a variable number of identical modules 15 to be added to the bus 14 to provide a variable bit-width binary to unary encoding scheme. In operation, the bus controller 13 initialises all the modules 15 via the control and data bus 14 at power-on or reset time, giving each of them a unique address. After that initialisation, n-bit binary data fed into the bus controller at 12 is passed in parallel to all the sub-modules 15, and depending on each module's unique address (initialised by the bus controller as described) the modules 15 each decode a unique range of the of the n-bit binary input signal values into p unary outputs, for a total of p.r unary outputs. In one implementation, p is an integer power of 2, e.g. p=$2^q$, and the sub-modules 15 are implemented as shown in FIG. 9 where the n-bit binary input data section of bus 14 is seen to split into two groups of bits, 21 and 22, with group 21 comprising the q low order data bits and group 22 comprising the n-q-1high order data bits (excluding the data sign bit) of the bus 14. The q low order data bits 21 are fed into a q-bit unipolar binary to unary encoder 18 where they are converted into p output unary signals at 23 which in turn are connected to the uin inputs of logic block 20. Logic block 20 acts as a switch between the p unary signals 23 at its input uin and the p unary signals 16 at its output uout, and is controlled by two input lines All and Enable. If the All input is on (logic 1) then all p unary outputs 16 are turned on, independent of all other inputs to block 20. If the Enable input is on, then each of the p unary outputs 16 take on the state of the corresponding one of the p unary inputs 23, providing a straight-through gating function. Finally, if neither All nor Enable is on, then all p unary outputs 16 are turned off. The n-q-1 high order data bits (excluding the data sign bit) 22 of the bus 14 are connected to a latch 17 and a magnitude comparator 19. The latch is controlled by signals from control block 25 which in turn connects to the data and control bus 14 via the bus signals 24, which serve to allow the bus controller 13 to load a unique value into each latch 17 at system initialisation time via a mechanism described below (and illustrated in FIG. 10 described later). In operation, after initialisation, the n-q-1 bit value stored in latch 17 which is fed to input B of n-q-1 bit magnitude comparator 19, is continuously compared to the value on the upper n-q-1 data lines (excluding the sign bit) of the data and control bus 14 which is fed to input A of magnitude comparator 19. The A>B output of comparator 19 is connected to the All input of logic block 20 while the A=B output of comparator 19 is connected to the Enable input of block 20. The net effect of this circuitry is that whenever the binary input data has a value less than the value held in the latch 17 (taking into account its bit significance) then none of the p unary outputs of its associated sub-module 15 will be on. Whenever the binary input data has a value greater than the value held in the latch 17 (taking into account its bit significance) then all of the p unary outputs of its block 15 will be on. Finally when the binary input data has a value equal to the value held in the latch 17 (taking into account its bit significance) then the remaining q low order bits will be encoded into 0 to p unary outputs by encoder 18. If r such sub-modules 15 are connected in parallel to the bus 14 each programmed with a different value in their respective latches 17 then the whole assembly will completely encode the n-bit binary input value onto the p.r unary output lines as required. This configuration has the virtues of simplicity, modularity, and easy extensibility to greater numbers of identical modules 15 and greater numbers of input bits n.

Figure 10:
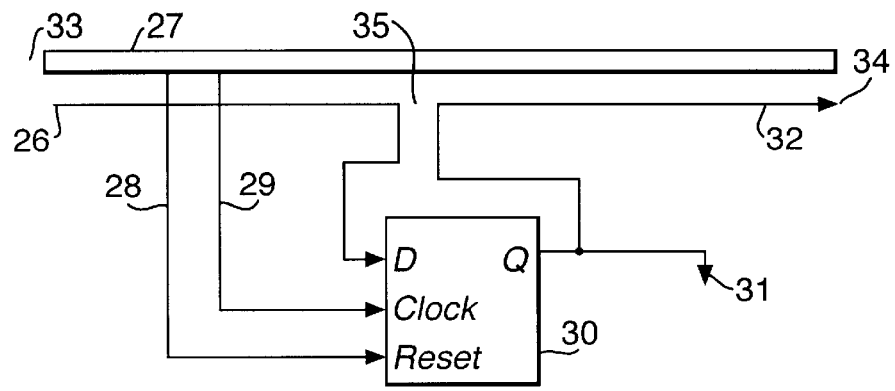
FIG. 10 illustrates details of the simple flip-flop logic incorporated into each of the modules 15 of FIG. 8, in order to allow each to be uniquely programmed by the bus controller 13 illustrated in FIG. 8.

FIG. 10 illustrates a general method of allowing the interconnection of multiple identical modules on a parallel bus structure and providing means of independently controlling each of them, even though they contain no hard-wired unique identification codes. In FIG. 10, 27 represents a data and/or control bus for connection to multiple modules in parallel, similar to, e.g., the data and control bus 14 in FIGS. 8 & 9. One of the lines in the bus 27 is shown separately as 26 and 32, and is broken at each module connection location on the bus as shown at 35. The end of the bus in the direction of the bus controller (e.g. 13 in FIG. 8) is shown as 33 and the control line 26 from that direction is connected to the D input of a standard D-type flip-flop 30 whose Q output is connected so as to drive the line 32 of the bus away from the bus controller, and towards the next module on the bus. The clock and reset control inputs of flip-flop 30 are connected to suitable bus control lines as shown at 29 and 28. Whenever line 31 in a module is at logic 1, that module will respond to programming information on the bus lines 27, but will otherwise ignore it (because of other circuitry in the module, not shown, but controlled by line 31). In operation, to control separately and uniquely all of the modules on the bus 27, each with control circuitry as shown in FIG. 10, the bus controller (not shown in FIG. 10) first issues a reset signal on the line 28 which clears the flip-flops 30 in every module, after which it places a logical high on the Din line 26 which connects only to the first module on the bus. The bus controller then issues a single clock pulse on the clock line 29 which clocks every flip-flop 30. As all flip-flops 30 were previously reset, and all but the first on the bus receive D input signals from the Q outputs of previous flip-flops 30 on the bus line 32, only the first flip-flop 30 on the bus will clock in a logic 1, all the rest clocking in a logic 0. At this point the bus controller places a logic 0 on the Din control line 26 and issues any required control signals destined uniquely for the first bus module. Only module 1 will respond to the control information as it will be the only module whose line 31 is at logic high as previously described. Thereafter, the bus controller maintains a logic 0 on the Din control line 26, and issues successive clock pulses on line 29 which have the effect of shifting out the logic high on line 31 of one module into the flip-flop 30 of the next module, whilst shifting in logic zeroes everywhere else, the whole structure operating similarly to a serial shift register, and between successive clock pulses the bus controller issues programming and control information for the one module currently activated by its control line 31 which is currently holding the single pulse in the shift register structure so formed. If desired, the bus controller may additionally be connected to the far end of the control bus (away from the bus controller) via a spare line, connected to line 32 in the last module only on the bus, and in this way, by awaiting the arrival of the shifted-through pulse in the shift register, the bus controller can determine that all modules on the bus have been programmed, and may also count the number of such modules present, which is useful in a variable modular structure where flexible programmability is desired.

As the transducers 4 in FIG. 1 are what produce the external sound (acoustic) power from the electrical signals within the digital loudspeaker, the transducer drivers 3 have to raise the digital signal levels to a power level adequate to produce the desired output sound power, taking into account the efficiency of the output transducers. The level required will depend on the type of transducers used, e.g. piezo-electric, electrostatic, moving-coil magnetic, or magnetor-estrictive. In digital logic terms, the transducer drivers 3 are simply pulse amplifiers. In practical terms, they may also be required to produce some pulse shaping, to compensate for the electro-acoustic transfer function of the transducers 4, so as to maintain an approximately square sound-pressure-pulse shape.

Figure 11:
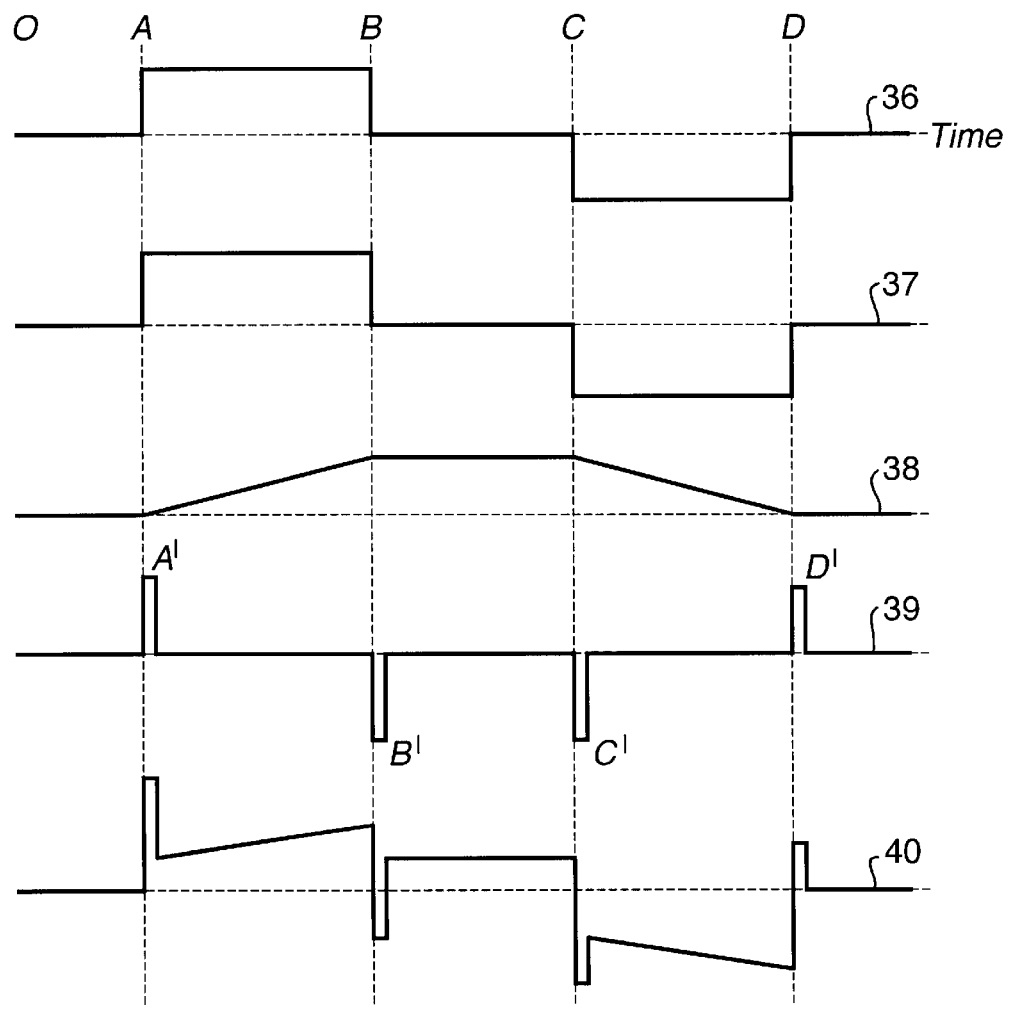
FIG. 11 illustrates an example unary signal waveform and associated suitable drive waveforms for acoustic transducers with various dynamical properties in order to produce acoustic pulses of approximately square shape.

FIG. 11 shows five electrical waveforms 36, 37, 38, 39, 40 as a function of time along the horizontal axis. 36 represents a typical bipolar unary electrical signal available from the binary to unary encoder after combination with the sign information, which corresponds to the desired pressure output from one transducer of the digital loudspeaker that is the subject of this invention. The waveform section shown encompasses a period of zero pressure demand between time 0 and time A, a constant positive pressure demand from time A to time B, a further period of zero pressure demand from B to C, followed by a period of constant negative pressure demand from C to D, and thereafter zero pressure demand. To a first approximation, the transducer diaphragm must move with constant velocity to produce constant pressure, and zero velocity to produce zero pressure, and therefore waveform 37 is illustrative of the required velocity (not position) profile with time for a transducer to produce the pressure profile shown in 36. For a transducer where the dominant reaction force on the diaphragm is resistive or viscous due to the resistance of the air being moved in the production of sound, then waveform 37 represents a suitable force-time profile to achieve the desired pressure wave-shape in 36, and in turn is also frequently a suitable electrical drive wave-shape, so essentially no pulse shaping is required in this case. For a transducer where the dominant reaction force on the diaphragm is a restoring force proportional to the deflection of the diaphragm, as might be produced by a diaphragm suspension, then waveform 38 represents a suitable force-time profile to achieve the desired pressure wave-shape in 36, where it will be seen to consist of constant ramp-rate sections between A and B, and C and D, of opposite slope, and constant levels of zero slope elsewhere, since such constant ramp rates correspond to linear increases of force, and thus approximately displacement with time, resulting in approximately constant pressure output for these periods. For a transducer where the dominant reaction force on the diaphragm is inertial due to the mass of the moving parts of the transducer and entrained air, then waveform 39 represents a suitable force-time profile to achieve the desired pressure wave-shape in 36, where at time A a short duration positive driving force terminating at time A' is produced to give a positive impulse of momentum to the transducer's moving mass, after which the mass coasts at approximately constant positive velocity until time B, where it is given a short negative impulse until time B' to bring it quickly to rest again, whereafter at time C a further short negative impulse is given until time C' to give the moving mass a negative impulse of momentum, followed by a further coasting period at substantially constant negative velocity until time D at which a short positive impulse until time D' is applied once more bringing the moving mass to rest. For a transducer with mixed dynamics where the dominant forces are some combination of the three identified above, a composite drive waveform, an example of which is shown at 40, comprising some suitable linear combination of 37, 38 and 39 may be applied to produce square-form acoustic pulse pressure output as required.

Figure 12:
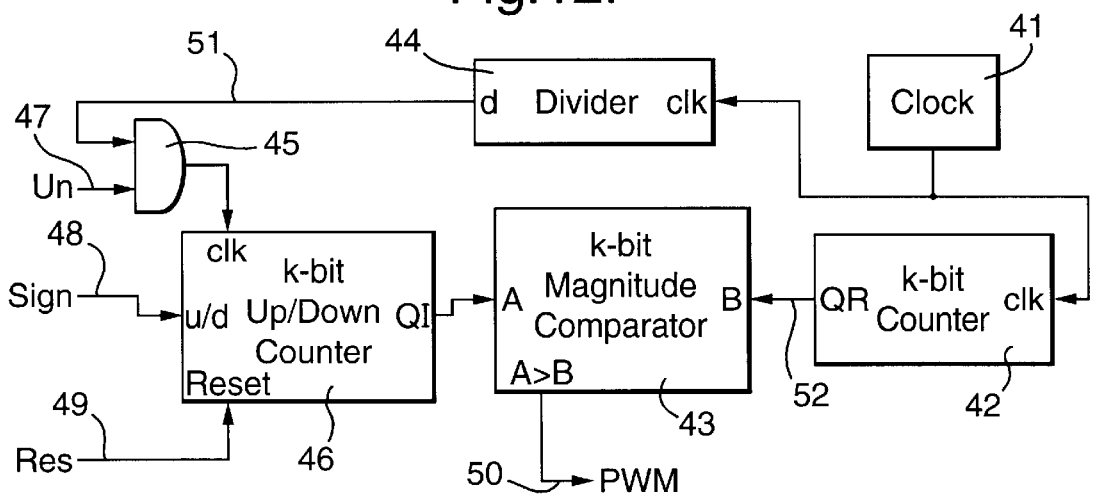
FIG. 12 illustrates simplified logic for a digital pulse width modulation (PWM) system for producing linear ramp PWM waveforms from a unary signal and a sign (polarity) signal.

Waveform 37 may be produced with high electrical efficiency in a standard pulse amplifier. Waveform 38 may also be produced with high electrical efficiency by means of pulse-width-modulation (PWM) of a suitably high frequency pulse waveform in the following manner. FIG. 12 illustrates a novel digital PWM Ramp Generator, comprising a high frequency clock generator 41 (with period very much shorter than the minimum width of pulses $U_n$ at 47), which feeds into the clock input of a k-bit binary counter 42 with parallel binary output QR at 52 which in turn feeds into one of the two parallel binary inputs (B in this example) of a k-bit binary magnitude comparator 43. There is also a digital divider 44 connected to the clock 41, the output d of 44 shown as 51 being connected to one of two inputs of an AND-gate 45. The unary signal U, shown at 47 which is to be shaped as a ramp as shown for example at 38 in FIG. 11, is connected to the other input of the AND gate 45 with the result that whenever $U_n$ is at logic one, clock pulses from d of divider 44 issue from the output of the AND gate 45 from where they are connected to the clock input of k-bit binary up/down counter 46, and otherwise the output of the AND gate is at logic low. Up/down counter 46 has its up/down control input connected to the sign-bit (or unary sign signal) of the digital loudspeaker circuitry and determines whether counter 46 will count up when a clock pulse arrives at its input, or count down. The reset input of counter 46 is arranged to set the counter to half full count when activated (e.g. if k were equal to 10, so that 46 had a maximum count of $1023_{10}=1111111111_2$ (binary), then reset would be arranged to set the counter to $511_{10}=0111111111_2$ and is connected to an external signal Res shown at 49 which can for example be issued by the bus controller 13 at system initialisation time, or possibly at other times when the desired output signal from the unary output $U_n$ was zero. The k-bit parallel binary output QI of up/down counter 46 is connected to the parallel binary input A of comparator 43, such that the comparator continuously determines the magnitude of the output QI of 46 relative to the magnitude of the output QR of 42, output A>B of comparator 43 then being at logic high whenever QI>QR. Details of data synchronization are not shown for simplicity. The effect of this logic circuitry is that after reset time (i.e. after a Res pulse has been sent to 49 from outside the circuit block) and while $U_n$ remains at logic low, the counter 46 stays static at half-full count while counter 42 cycles throughout its k-bit count range with period $P=2^k/f$ where f is the frequency of digital clock 41, and thus output PWM shown at 50 derived from output A>B of 43, spends precisely half its time at logic low and half at logic high. This output 50 therefore has period P and mark-space ratio of 1:1. Starting from this state, when $U_n$ goes to logic high, then depending on the state of the Sign input, counter 46 either counts up or down from its initial half full count at a constant rate determined by the divided clock signal 51 so that its instantaneous output value V available in parallel binary at Ql from counter 46 is linearly varying with time at a rate of f/D counts per sec, where D is the division ratio of clock divider 44. If the clock rate f of counter 42 is large compared with f/D (i.e. if D>>1) then V may be assumed substantially constant over a counter 42 period P, in which case the PWM signal 50 will be high for the fraction $V/(2^k-1)$ of the period P where $0 \leq V \leq (2^k-1)$, which is exactly the condition required for the signal 50 to be a linear pulse width modulated representation of value V. It can be shown that even when the condition f>>f/D does not hold, that the circuit still produces linear pulse width modulated signals at output 50. As the value V increases or decreases linearly with time when $U_n$ is at logic one (depending on whether Sign is at logic high or low), the effective value of the PWM output 50 (which is just the time average of output 50 during a period as long as or longer than the period P) is a linear ramp while $U_n$ is on and a static value when $U_n$ is off, which is precisely the condition required to generate the type of waveform illustrated at 38 in FIG. 11, for driving spring-limited transducers to produce clean square digital acoustic pulse outputs. In practice additional circuit refinements are useful, one of which is to configure counter 46 as a dead-end counter so that when it reaches either maximum or minimum count it will not roll-over, but instead remain at its terminal count value until the count direction (up or down) reverses and the next clock pulse arrives. This adds significant stability to the PWM generator. It is not essential that the clock input clk on counter 46 be derived from the same clock 41 as used for counter 42 as shown, although this again assists with stability. Additional stability can be achieved in the digital loudspeaker application of this circuit by synchronizing clock 41 with the digital loudspeaker input-data sampling clock, and separately, by driving the Res input 49 high, whenever the input data word value on the control bus represents zero. Also, for the digital loudspeaker application, it is essential that the full-count period of counter 46, which is $T=2^kD/f$ is greater than or equal to the half-period of the lowest frequency audio signal that it is desired to be faithfully reproduced by the speaker, typically 25 ms for a 20 Hz lower cut-off frequency. In the application of this PWM generator for a digital loudspeaker it should be noted that circuit components 41, 42 and 44 may be shared amongst a large number of individual PWM generators assigned each to a distinct unary output $U_n$, so the saving in parts is considerable. It should be noted that this digital method of creating pulse width modulated waveforms has applications outside of digital loudspeakers wherever PWM is useful.

Figure 13:
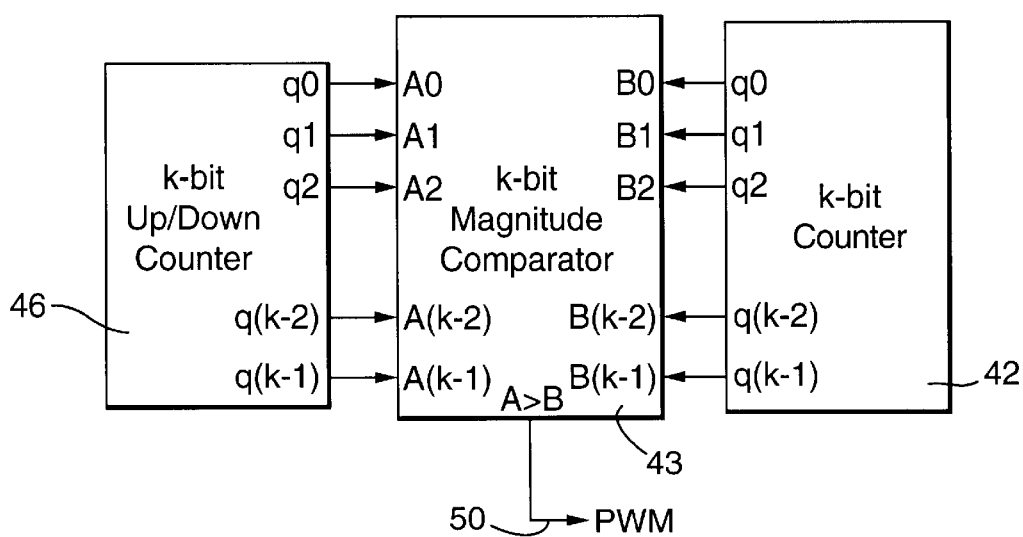
FIG. 13 illustrates the conventional manner of interconnecting the counters and the magnitude comparator that are components of the system shown in FIG. 12.
Figure 14:
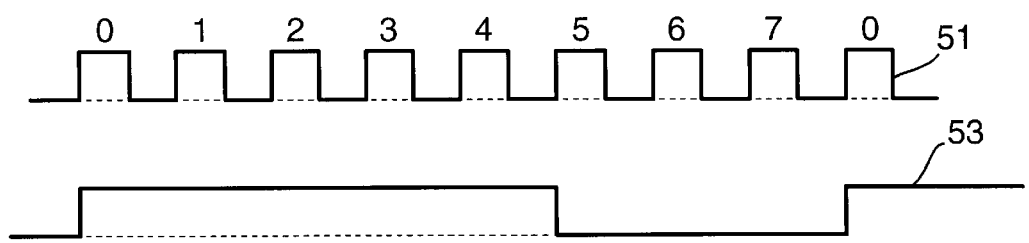
FIG. 14 illustrates typical PWM waveforms produced by the circuit of FIG. 12 with the interconnection pattern shown in FIG. 13.
Figure 15:
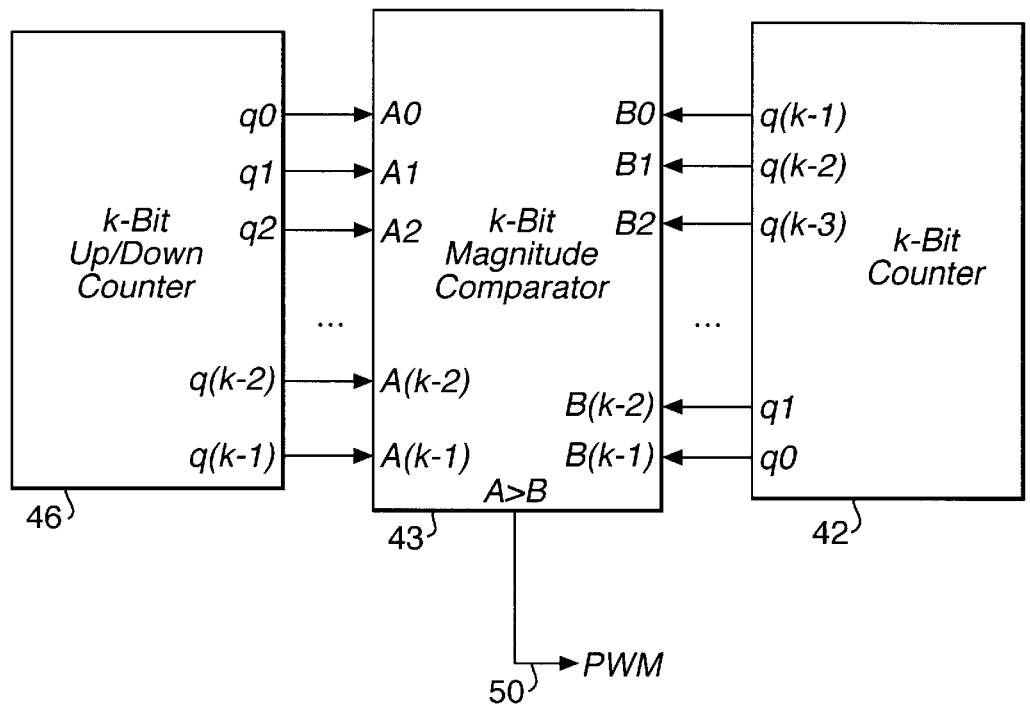
FIG. 15 illustrates an improved method of interconnecting the counters and magnitude comparator of FIG. 12.
Figure 16:
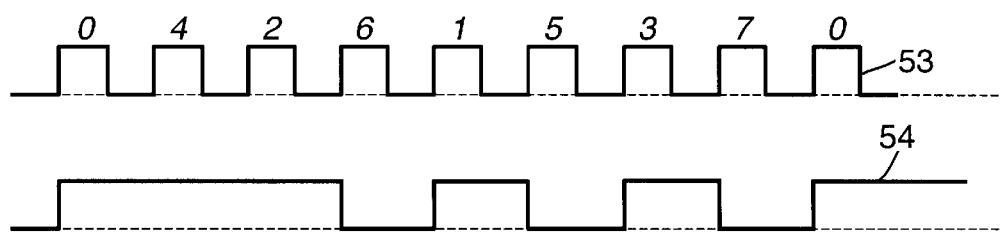
FIG. 16 illustrates the improved PWM waveforms produced by the interconnection pattern of FIG. 15 when applied to the circuit of FIG. 12.

A common requirement of PWM systems is a low pass filter system to reduce the high frequency switching noise in the final output drive waveform. Such low pass filters are more complex and expensive to construct, the closer the PWM clock rate is to the highest modulation frequency required to be reproduced in the low pass filtered output. A method using no extra components, of maximizing this frequency ratio for a PWM generator of the kind illustrated in FIG. 12 is now described. FIG. 13 shows in some more detail the conventional method of interconnecting k-bit word logic devices together, such as the two k-bit counters 42 and 46 to the k-bit magnitude comparator 43, where it will be seen that the least significant bit (LSB) outputs of the counters 46 and 42 shown as $q_0, q_1, q_2, \ldots$ are connected to the LSB inputs of the comparator 43 shown as $A_0, A_1, A_2, \ldots$ and $B_0, B_1, B_2, \ldots$ and the rest of the bits are connected in the same sequence right through to the most significant bits (MSB) $q_{k-1}$, connected to $A_{k-1}$, and $B_{k-1}$. This method of connection results in a PWM output waveform at 50 that has a pulse period of $2^k/f$ where f is the clock frequency of counter 42 and k is the number of bits in that counter. As an example, for the simple case where k=3, and where the value (assumed static) represented by the output of counter 46 is $101_2=5_{10}$ then FIG. 14 shows at 53 the expected waveform at output 50 with mark:space ratio of 5:3, and at 51 the clock input signal to counter 42 and marks the counter 42's count state above each clock pulse as 0, 1, 2, . . . 7, 0, etc.. Waveform 52 results because while counter 42 is in the first five states 0 to 4 its output is less than that of counter 46 assumed static at value 5 in this example, and so the A>B output of the comparator is at logic high for these states, after which it goes low for the rest of the counter 42's cycle. In the improved version of the circuit, shown in FIG. 15, it will be seen that the bit order of the connections between the k bit outputs of counter 42 and the k bit inputs of comparator 43 have been reversed so that the MSB bit of the counter $q_{k-1}$ is now connected to the LSB input $B_0$ of comparator 43 and this bit-order reversal is carried through for the other bit connections between these devices right through to $q_0$ connected to $B_{k-1}$. The effect of this bit reversal is to alter the count sequence seen on the $B_i$ ($0 \leq i < k$) inputs of comparator 43 when viewed in the conventional bit order, with $B_0$ being the least significant bit of this comparator input. The actual count sequence seen for the previously given example (with k=3, and where counter 46 has value 5 on its outputs) is shown at 53 in FIG. 16. The resulting PWM output from 50 in the modified circuit is shown at 54 in FIG. 16, where it will be seen that whilst it still has the same required average mark-space ratio as the previous arrangement (shown at 52 in FIG. 14) of 5:3, it now consists of three cycles during one period of counter 42 rather than just one. This is precisely the effect required to reduce the effort of low pass filtering. It will be apparent to those versed in the art that this novel technique of raising the effective pulse rate of the PWM output waveform is generally applicable to all applications of pulse width modulation and is not restricted to use in the digital loudspeaker invention presented here. Other re-orderings of the bit connections between 42 and 43 than the one shown here are useful in this respect but it can be shown that the bit-reversal ordering gives the maximum number of output transitions over the full range of PWM output states. In particular, the bit-reversed ordering produces an output at 50 that transitions on each clock pulse to counter 42 when the counter 46 is at half-full count, which is the maximum possible output frequency from such a circuit, with 50% or 1:1 mark-space ratio.

Figure 17:
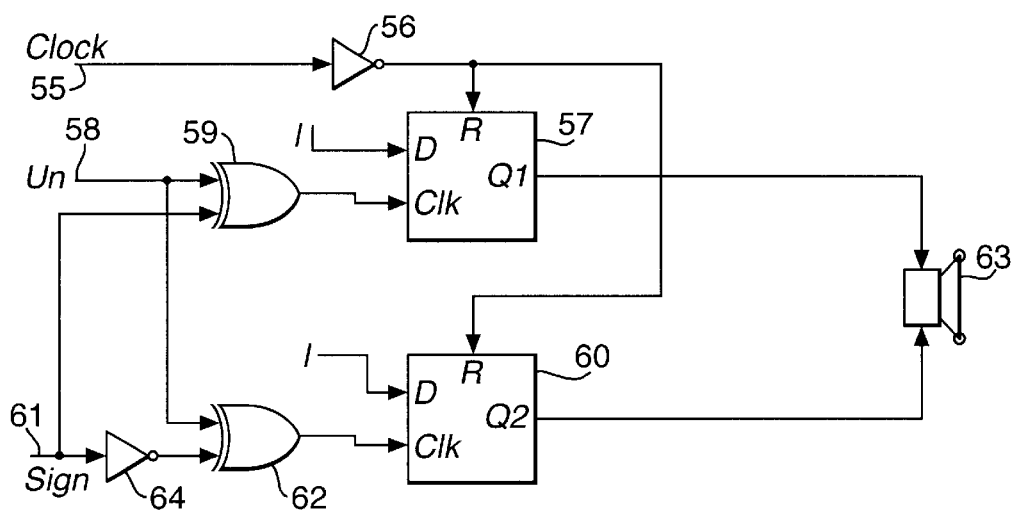
FIG. 17 illustrates a simple logic circuit for producing a dual bipolar impulse drive for a transducer with inertia-dominated dynamics.
Figure 18:
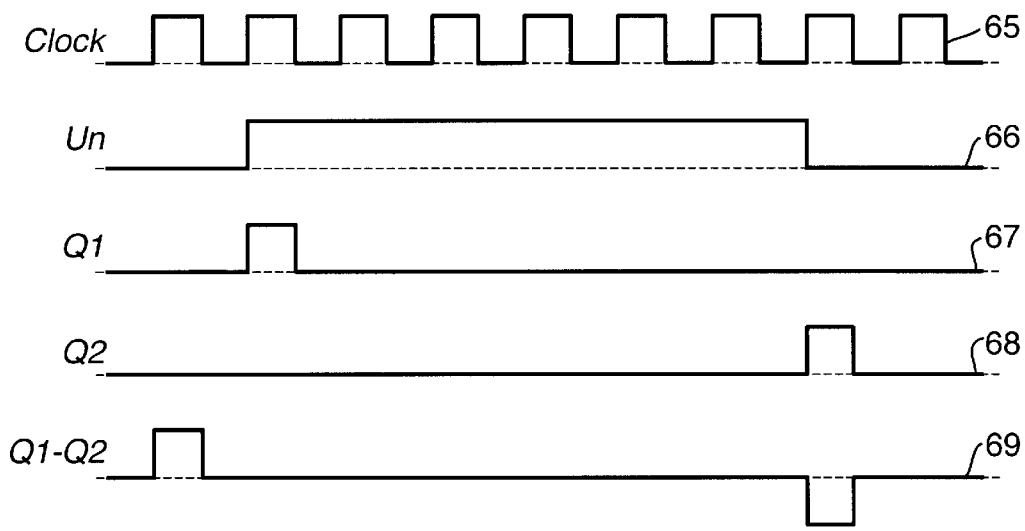
FIG. 18 illustrates typical waveforms for the circuit shown in FIG. 17.

A digital method of producing a waveform of the type shown at 39 in FIG. 11, for the driving of mass-limited (inertia dominated) acoustic transducers is illustrated in FIG. 17, where a unary input signal $U_n$ at 58 and the Sign signal drive the clock inputs Clk of a pair of flip-flops 57 and 60 via a pair of exclusive-OR gates 59 and 62 and an inverter 64, in such a way as to clock in a logic-1 into the D input of one of the flip-flops on the leading edge of the $U_n$ signal and into the other flip-flip on the trailing edge, which flip-flop responds to which edge being dependent on the Sign signal. In the configuration shown, when Sign is at logic low then flip-flop 57 is clocked by the leading (rising) edge of $U_n$ and flip-flop 60 by the trailing (falling) edge. The leading and falling edges of $U_n$ are arranged to be synchronous with the rising edges of the clock signal Clock at 55 (whose waveform is shown schematically at 65 in FIG. 18) which is applied through an inverter 56 to the reset inputs R of the flip-flops 57 and 60. The net effect of this configuration is that when $U_n$ goes high (see FIG. 18 waveform 66) one of the flip flop outputs goes high and is then reset to 0 half a clock cycle (of Clock) later as shown at 67 and when $U_n$ next goes low the other flip-flop output goes high for half a cycle of Clock and then goes low too as shown at 68. If the two flip-flop outputs Q1 and Q2 are used to drive a transducer 63 in push-pull as illustrated in FIG. 17 either directly or via transducer driver circuitry, the transducer is driven by their difference signal which is shown at 69 in FIG. 18. This waveform is precisely of the form required, as shown at 39 in FIG. 11, to drive an inertia dominated acoustic transducer in order to produce clean acoustic pulses.

Because the output of the digital loudspeaker is synthesised from a large number of pulses, rather than smooth analogue waveforms, there will be frequency components in the output outside the normal range of hearing generally reckoned to be ~20 Hz to ~20 KHz. As these components are by definition inaudible to humans, it is possible to simply ignore them. However, loud sounds in the range 20 KHz to 60 KHz can cause a certain amount of alarm and distress in domestic animals, and it may be necessary to reduce such emissions as much as possible.

One approach is to place an acoustic low-pass filter over the output transducer array to absorb such frequencies directly at their point of generation. A material with a heavy sound absorption above ~20 KHz but which is practically acoustically transparent below ~20 KHz will provide the required filtering.

A second approach is to minimise the high frequency emissions from the transducers themselves. This can be done by ensuring that even at the highest frequency of operation, the resolution of the digital loudspeaker (in terms of bits, or unary digits) is kept as high as possible. The nyquist theorem tells us that to adequately reproduce a 20 KHz sine wave from digital samples we need to sample at a frequency of at least 40 KHz. In practice, reproduction of a sine wave from so few samples (i.e. just 2 per cycle, when sampling at the nyquist rate) can only be achieved with a perfect low pass filter. The filtering requirements can be much reduced if instead we sample at a rate much higher than the nyquist rate. If the digital input signal is available at a suitably high sampling rate then no more needs to be done other than to maintain that sampling rate throughout the digital loudspeaker. If, however, one was to drive a practical digital loudspeaker from, say, digital audio signals derived from a Compact Disc, which is sampled at ~44 KHz, then one would need to interpolate the digital samples to create a higher sample rate. Such a process is already done to some extent in better quality compact disc players to ease the filtering requirements when converting the digital signals to electrical analogue signals for further amplification. Here, we are suggesting that a similar process be performed on low-sampling rate digital input signals to ensure that the sound output signals from the digital transducers of the digital loudspeaker should have less spurious high frequency content.

This design of digital loudspeaker using unary code at the output transducers, ensures that individual transducers will turn on and off only once per cycle of sine wave output, independent of the resolution of the digital output, enabling this digital interpolation process to be carried out to any degree without increasing the specifications of the output transducers in terms of their frequency response. This independence is not the case if binary, ternary, or other number— (greater than or equal to 2)—based digital coding is used.

In order to minimize path differences between listeners and the individual transducer elements of the loudspeaker, it is necessary to minimize the spatial extent of the transducer array. Preferable arrangements include laying out the transducers in as tight a two-dimensional arrangement as possible, and regular circular, hexagonal and square array shapes are close to optimum from this perspective. A second preferable method of reducing the spatial extent of the array of a given number of transducers, is to make the transducers themselves smaller across their aperture. Thus in a preferred embodiment compact two-dimensional arrays of small aperture transducers are used.

Figure 19:
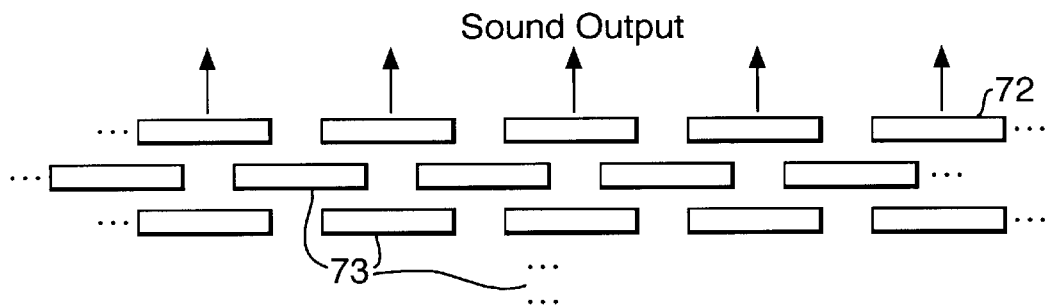
FIG. 19 illustrates in section how multiple two-dimensional arrays of transducers may be stacked in three dimensions to produce a more compact sound source when gaps are placed in each array to allow through the passage of sound.
Figure 20:
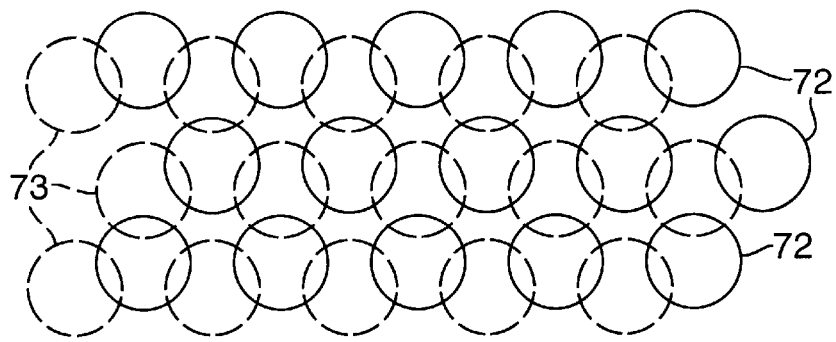
FIG. 20 illustrates in plan view a similar arrangement to FIG. 19.

A further preferred method of minimizing such path differences is possible if the transducers themselves are thin, front to back; then the array size can be reduced even further by producing a multi-layered three dimensional arrangement of transducers where a front two-dimensional array of transducers is placed in front of one or more further two-dimensional arrays of transducers behind it, with the sound from the rear arrays passing through gaps between the elements of the front arrays, or through holes in the transducers themselves. If the transducers are necessarily circular (for example, because of their method of construction), then any regular array of circular devices necessarily has gaps in it, as circles of one size do not tessellate. This multi-layered two dimensional arrangement then becomes attractive, and allows a very compact array to be constructed, even when using a large number of transducers. Staggering successive two dimensional arrays allows the centres of the rear transducers to align with the centres of the gaps or holes in the front transducer arrays. FIG. 19 showing a side view and FIG. 20 showing a front view of such a three-dimensional array of transducers 72 illustrates these principles. In order to synchronize the sound pulses received by the listener from the different layers in the third dimension, it may be desirable to add differential digital delay to the signals in each layer to compensate for their different distances from the listener (see below).

Figure 21:
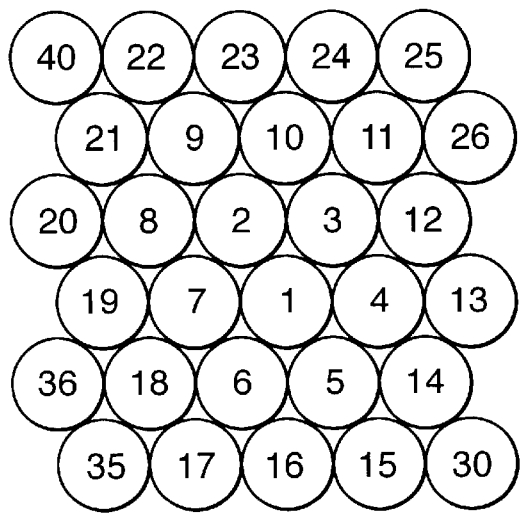
FIG. 21 illustrates a compact two-dimensional ordering of transducers each positioned so that it is adjacent to transducers associated with adjacent signal levels.

Because unary digital code has no particular positional significance, we are free to connect the unary digital outputs from the transducer drivers, to transducers in the array(s) in any spatial manner suitable. As quieter sounds will be reproduced with smaller total numbers of transducers active than louder sounds, it is optimal to keep transducers related to adjacent input signal levels physically adjacent in the output transducer array. In this manner, the overall size of the sound source is kept as compact as possible at all sound output levels. Furthermore, if the geometric centre of the group of transducers used to reproduce any particular sound level, is kept as close to the geometric centre of the whole array as possible, then the apparent sound source position will appear to move the least with changes in reproduced sound level. Thus, preferred patterns of interconnection of transducers to transducer drivers, include tight spirals centred on the geometric centre of the array (with the obvious extension to three dimensions if a multi-layered array is used). FIG. 21 illustrates this principle for the special case of a hexagonal two dimensional array of circular transducers in each of which is shown a number relating that transducer to a particular input level at which it turns on. Its extension to square arrays and other regular two-dimensional and three-dimensional array structures is straightforward.

In order for the listener's ear & brain to be able to properly integrate the array of pulses from the digital loudspeaker so as to reconstruct the desired sound, it is important that sound pulses from the different transducers in the output array arrive with the correct time relationship (i.e. at the same relative times as the parts of the original input signal they represent). As the transducer array is distributed in space in two or three dimensions, a listener not placed a very long way from the loudspeaker will hear the different sound pulses at times affected by the spatial positions of their corresponding transducers in the array. The transducers $T_i$ (i=1, ... N) in general are at unique distances $D+d_i$ from a listener L, where D is the distance to the nearest transducer to L. The time of arrival $t_i$ of pulses at L emitted simultaneously from all transducers $T_i$ at time t will be $t_i=t+(D+d_i)/c$ [where c is the velocity of sound], which in general is different for every transducer.

Figure 22:
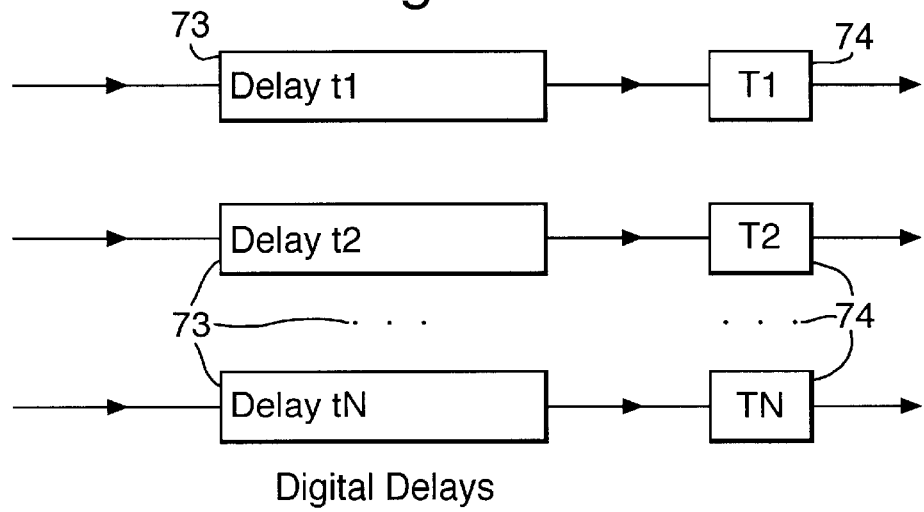
FIG. 22 illustrates a method of applying differential signal delays to each transducer in an array in order to compensate for differential listener-to-transducer path lengths.
Figure 23:
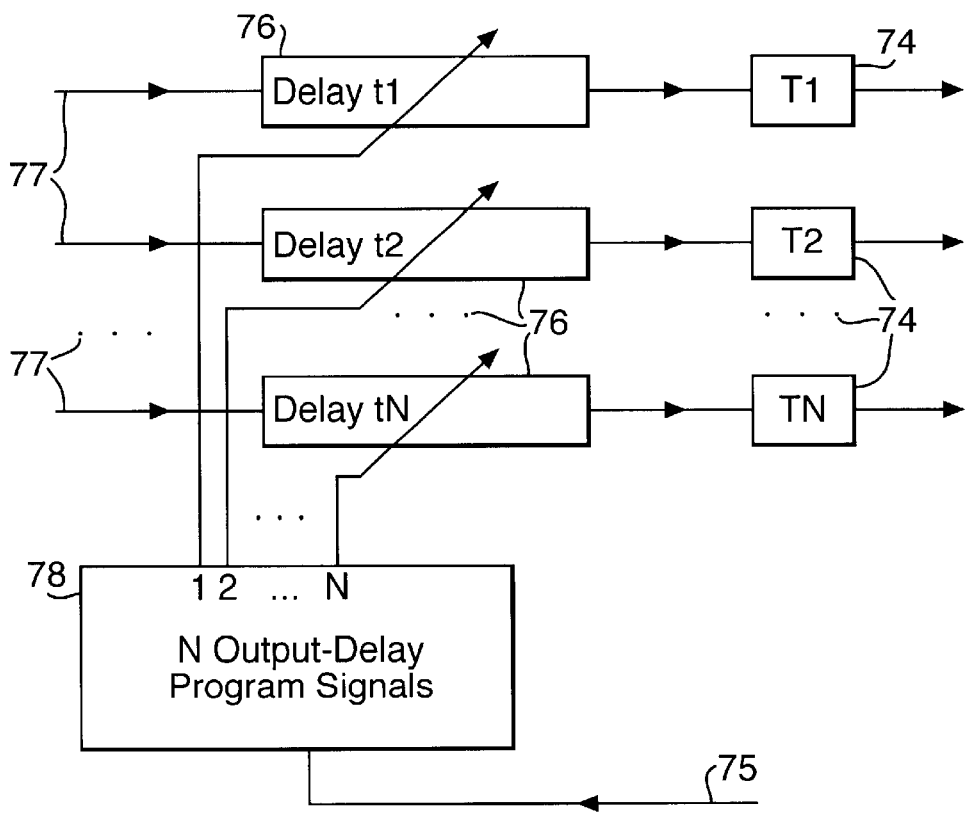
FIG. 23 illustrates how a delay system as illustrated in FIG. 22 may be made variable and programmable either dynamically or statically.

It is possible to completely correct for this undesirable effect, for any one given listener position L, and approximately correct for a wide range of listener positions, by adding differential digital time delay to the signals to each transducer. FIG. 22 illustrates how this is achieved:—N unary signals from the encoder are fed in at the left each to a separate digital delay line 73 producing delays $t_1, t_2, \ldots t_N$, chosen such that: $t_j=t_{MAX}-(D+d_j)/c$, where $t_{MAX}=(D+d_{MAX})/c$ and $d_{MAX}$ is the maximum value of $d_j$, and $t_j$ is the appropriate value of delay for transducer $T_j$ at distance $D+d_j$ from L. As the signals to each transducer are one-bit or unary digital signals, delay devices can be very simple (e.g. a 1 bit wide shift register, or suitably addressed RAM storage elements). The arrangement of the delays is such that the transducers closest to the listening position are delayed the most, and those furthest from it, the least, or not at all, so as to give the sound from the distant transducers a 'head-start'. In practice, the delay applied would be quantized to the nearest integral multiple of a suitable delay time (e.g. 5 $\mu$s, for maximum 10% error on a 20 KHz output signal). Thus a digital delay system with a 200 KHz clock and variable length real or synthesised shift registers in each transducer driver path would suffice. This may be integrated with the transducer drive electronics into an ASIC (Application Specific integrated Circuit), and the actual pattern of delays required for a particular transducer and listener-geometry programmed into the driver chip. This program could even be varied to suit different listening positions during use of the loudspeaker. This is illustrated in FIG. 23 where the N unary coded inputs arrive at the left at 77 and are fed into N programmable variable digital delay generators 76 with delays $t_1, t_2 \ldots$ to $t_N$, each digital delay being controlled by a signal from the digital delay program store 78 which receives program delay information from input 75. The outputs of the delay generators 76 eventually drive transducers 74 as shown schematically. The program delay information 75 can either be set up once before each use of the loudspeaker, or could alternatively be varied dynamically throughout the use of the speaker, and one application of this is to track the listener's position relative to the loudspeaker and optimise the delay pattern $t_1$ to $t_N$ for his current position.

The digital nature of the output transducers allows a method of volume level control that ensures that maximum signal resolution and maximum signal-to-noise ratio is attained at all levels of listening, with particular advantages at low listening levels. This invention includes two methods of volume reduction in the amplifier itself, right at the power generation point, so that noise and signal are reduced together, thus maintaining the inherent signal/noise ratio (snr) of the DLS/amplifier combination.

In one preferred method the output pulse amplifiers are supplied from a variable power-supply level, so that smaller pulse amplitudes are produced when a lower volume setting is used. The power supply output voltage is made to depend in some way, on the volume level setting chosen. In this case, output power is generally proportional to the square of supply voltage, giving a wide power output range whilst keeping the supply level within operating limits of the pulse amplifiers.

In a second preferred method pulse-width control is applied to the output transducer drivers, so that whereas normally the transducers are either on or off for an entire digital clock cycle, by contrast with pulse width control, the transducers that were previously on for the whole of each digital clock cycle are now all gated off for the same proportion of each such cycle. If the proportion of a cycle gated off is x % then output power is to be reduced to (100−x)%. However, apart from limitations caused by the finite rise and fall times of the transducer driver output pulse amplifiers, this method allows very wide range power level control, and may be implemented entirely digitally and with high electrical efficiency.

Both the above methods of volume or output power control can be used together if required to optimize their respective benefits.

The methods described above for volume control and low-level listening noise reduction, can also be used to reduce the total number of transducers needed in a DLS without reducing the effective resolution of the sound output. The method works by dynamically applying the low-level listening technique as a function of the actual level of the input signal. Thus, when input signal amplitudes are small, the output power provided by each output transducer is reduced proportionately, and when the input signal approaches its maximum permitted value, the output transducers are arranged to provide their maximum power. For example, consider a system with 16-bit signed binary digital input, but 1023 ($=2^{10}-1$) unary output transducers. Whenever the input signal magnitude is small enough that it can be expressed with 10 or less bits, the lowest 10 (excluding the sign bit) input bits are connected to a 10-bit unipolar binary to unary encoder and all the output transducers are driven from that, but each with output power reduced from full load to $\frac{1}{32}$ ($=\frac{1}{2}^5$) of full power; this reproduces the low level signal with exactly the same output resolution as if there were 32767 ($=2^{15}-1$) transducers. For intermediate levels of input the 10-input bits of the encoder in the example are connected to input bits 1-to-10, then 2-to-11, etc, up to 5-to-15 for the highest level of input signals. In this way, input signals greater than $\frac{1}{32}$ of maximum input level are always quantised to 10-bit precision right through to the output, and smaller signals to exactly the same precision as they would be with a full 16-bit DLS. The dynamic range of a 16-bit system and the precision of an 10-bit system are attained at much greater simplicity than with a full 16-bit system. The fact that a 16-bit CD digital system sounds adequately accurate even when reproducing music at levels very much lower than full amplitude indicates that the full 16-bit precision is not needed for adequate sound quality. It is necessary however for dynamic range. The scheme just described provides both of these features by effectively using a floating-point representation of the digital signal.

Figure 24:
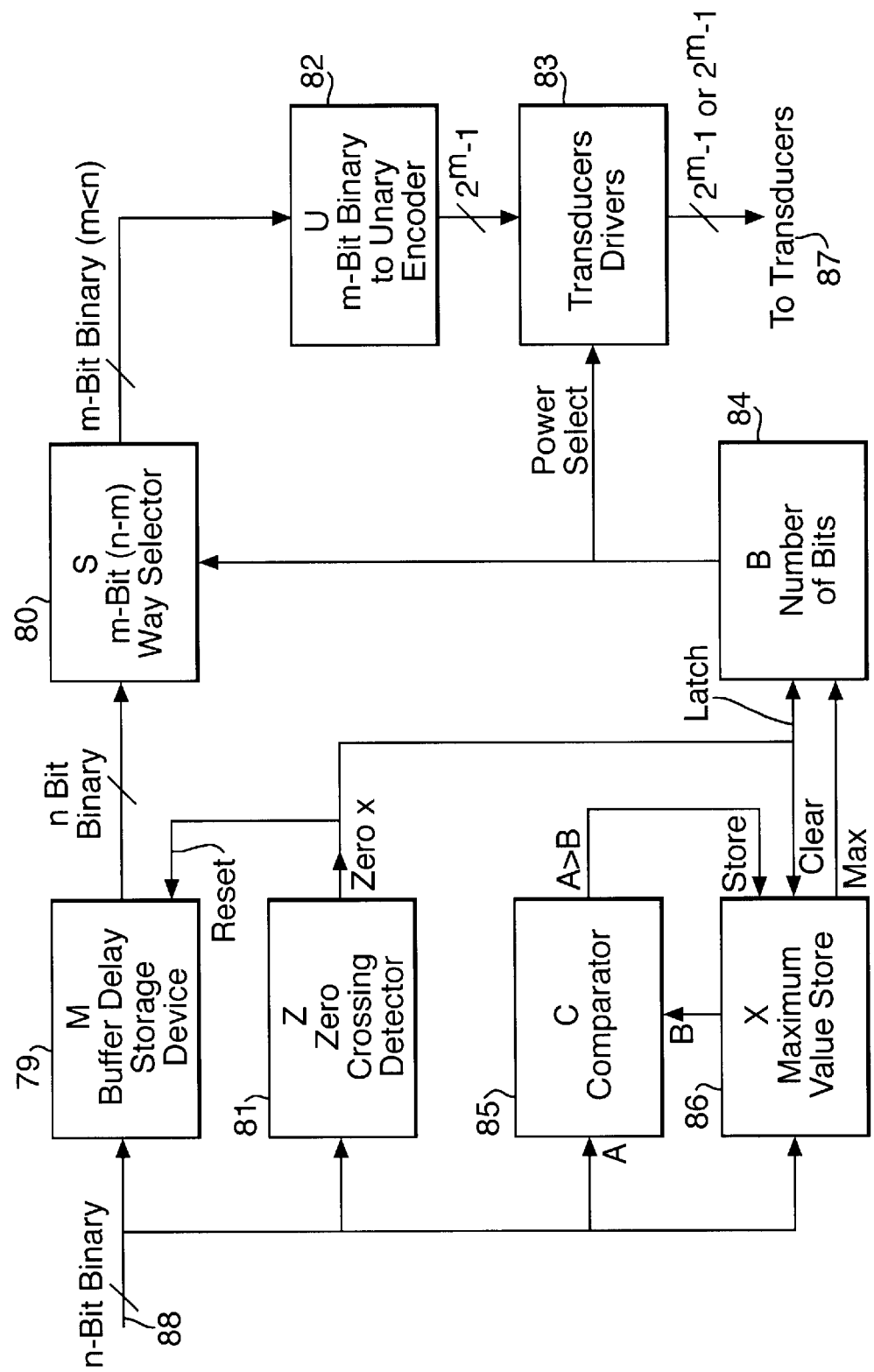
FIG. 24 illustrates in block diagram form a system to select a most significant subset of non-zero bits of an input signal and apply those bits to a number of unary transducers so as to maintain the desired input-output relationship whilst maintaining the highest possible resolution.

FIG. 24 illustrates one possible method of implementing this scheme though other methods are to be understood not to be excluded by the example given here. An n-bit binary input signal 88 is to be reproduced with an m-bit digital loudspeaker where m<n. The n-bit input signal 88 is fed into a digital buffer memory M at 79 capable of storing at least one half-cycle of the input signal at its lowest frequency (e.g. 50 ms for a 20 Hz low frequency limit). It is simultaneously fed to a comparator C at 85 and maximum value storage latch X at 86, such that during the half cycle, successively greater input values become stored in the maximum value latch 86. A zero crossing detector Z at 81 provides a signal at the end of each input half cycle. At this point, the value in the maximum value latch 86 indicates how large is the biggest signal stored in the buffer 79, containing the digital input samples yet to be reproduced (as they have been buffered in 79 and thus delayed). During the next half cycle, these stored samples are read out of 79 and reproduced by the loudspeaker whilst new values for the next half cycle are being stored. At the end of the half cycle, the value in 86 is latched into the number-of-bits register B at 84, which outputs an integer in the range 0 to n-m (where m<n as before). This number is used to select the power level of the output transducer drivers 83 for the half cycle (which may be controlled by a pulse width modulation technique, or a supply voltage variation technique, or both in combination, as described previously). It is also used to select which of the unsigned input bits 0 to n-2 will be passed from the buffer 79 to the binary to unary encoder U at 82. This selection is done by an m-bit wide, n-m way selector block S at 80, which takes its digital signal input from buffer 79 (n bits wide) and sends m of those bits onto the unary encoder 82.

Which bits it selects are determined by the signal from register 84. It always selects an adjacent group of bits, m bits wide, with the lowest output bit selected being in the range bit 0 to bit n-m, and the highest output bit selected being in the range m-1 to n-2, bit n-1 being the sign bit in this example.

Figure 25:
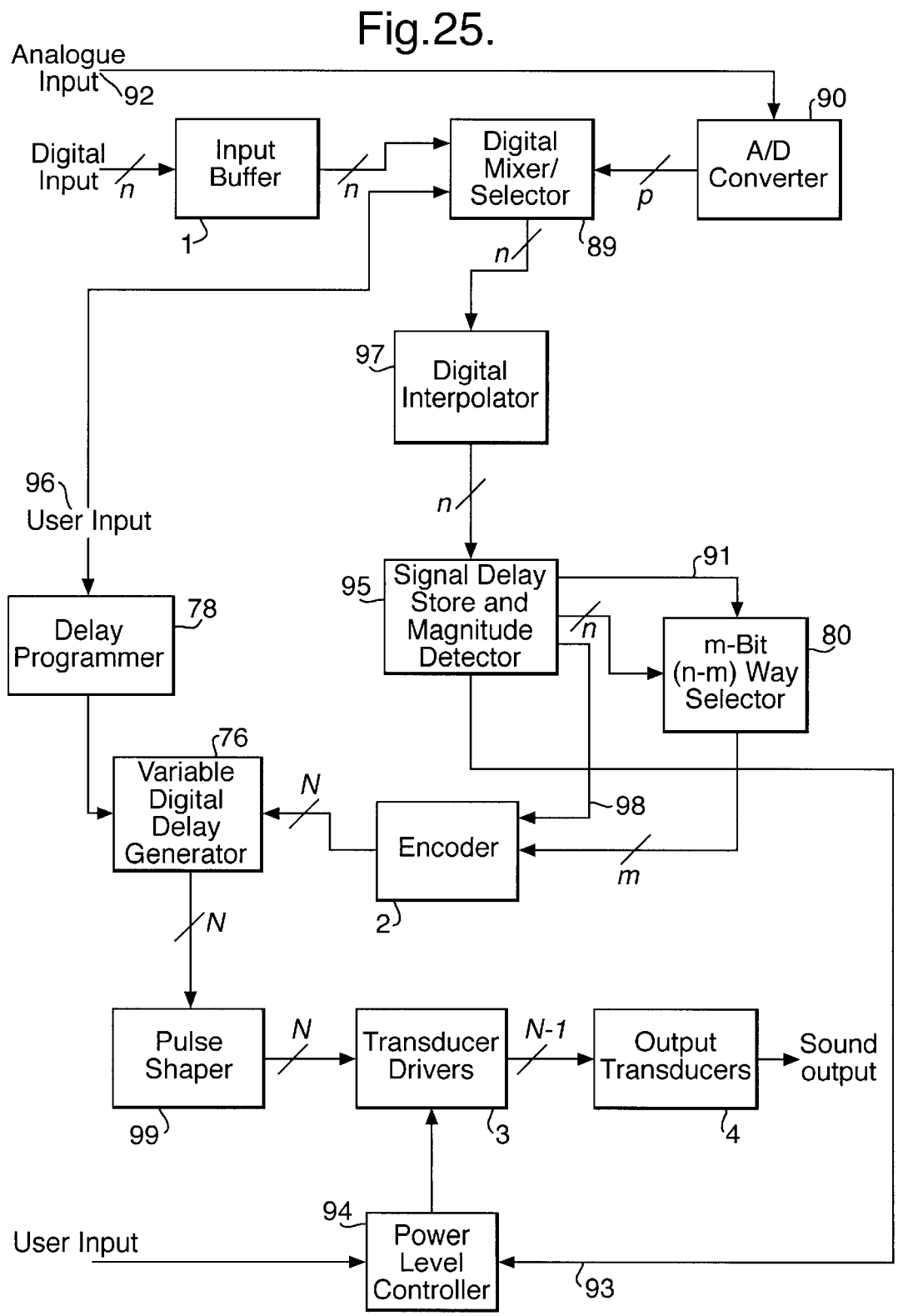
FIG. 25 illustrates in block diagram form a loudspeaker incorporating some of the inventions and designs described herein.

A specific embodiment of the invention incorporating many of the features described above is now described by way of example with reference to FIG. 25 in which a digital input signal consisting of n binary bits is applied to input buffer 1, with an optional analogue input at 92 connected to analogue-to-digital-converter 90, producing p binary output bits where $p \leq n$, the outputs of the buffer 1 and converter 90 being connected to the inputs of digital selector/mixer 89, which is controlled by input from a user at 96. Depending on the user input some combination of input signals is sent in n-bit binary form from mixer 89 to a digital interpolator 97 where the effective sampling rate of the input signal is optionally increased before the n-bit data is passed to the signal delay store and magnitude detector 95 where the input signal is delayed for a time up to half the period of the lowest audio frequency to be reproduced, and where the peak magnitude of the delayed signal is determined whose value is used to produce control signals 91 and 93. The delayed n-bit binary signal data are then passed to an m-bit (n-m) way selector (where $m \leq n-1$) controlled by signal 91, which emits m output binary (non-sign) bits connected to the input of binary-to-unary encoder 2. The sign bit is separately connected from delay store 95 directly to encoder 2 as shown at 98. The effect of store 95 and selector 80 are to select up to m bits plus sign of the n-bit input signal in such a way that the m most significant adjacent non-sign bits with a leading 1 are contained in the m-bit subset. Encoder 2 converts the m binary bits and sign bit into N unary signals where $N=2^{n-1}$ and where one of the N unary signals is a sign or polarity signal. The N unary signals are then fed to a variable length digital delay generator 76 controlled by delay programmer 78 whose mode of operation may be modified by the user at 96, where the differential delay of the various N unary signals may be adjusted to compensate for the positions of individual transducers 4 relative to listening position. The possibly delayed N unary signals then pass through pulse shaper 99 which may modify the square profile input pulses (not the sign signal) to different pulse shapes appropriate to the type of transducers 4 used, after which the N unary signals pass to the N-1 transducer drivers 3 which drive the N-1 transducers 4, the latter providing acoustic pulses which in combination constitute the output sound reproduced. The transducer drivers 3 are controlled by a signal from the power level controller 94 which in turn is controlled by an input 93 from the magnitude detector in 95 and also by user input which may include volume level selection. The effect of this control signal on drivers 3 is to modify the mean output power delivered to each of the transducers 4 when activated by a pulse signal, in such a way that the mean power level from the array of transducers 4 may be varied, in the presence of a fixed level input signal.

What is claimed is:

1. A loudspeaker comprising
   a plurality of substantially identical transducers each arranged to convert an electrical loudspeaker-input-signal into an acoustic output, wherein each transducer is driveable independently of all others by discrete-time-sampled digital signals representative of the sound to be produced by the loudspeaker, and wherein each of the transducers (4) is such as to produce pressure pulses when driven by an electrical signal, an encoder for converting a non-unary discrete-time-sampled digital input signal into a plurality of discrete-time-sampled unary digital signals, said encoder having an output coupled to said transducers; and wherein each transducer produces an approximately constant sound pulse for the duration of a unary digital drive signal pulse so that the cumulative effect of the transducers is to produce an output sound representative of the input signal.

2. A loudspeaker as claimed in claim 1 further comprising a pulse shaper for shaping the unary digital signals into a wave-shape appropriate to the transducers such that the output acoustic pressure pulses therefrom are approximately square in profile.

3. A loudspeaker as claimed in claim 2, wherein the pulse shaping means employs pulse-width-modulation techniques.

4. A loudspeaker as claimed in claim 3 wherein said pulse shaping means comprises a digital pulse-width-modulation (PWM) generator comprising:

an n bit digital magnitude comparator having first and second n bit inputs and an output indicative of the relative values of the signals applied at the first and second inputs;

a first n bit digital up/down counter having a count direction input coupled to receive a sign bit of a digital unary input signal, an n bit parallel binary count output connected to the first n bit input of the magnitude comparator, and a clock input;

a second n bit counter having a clock input coupled to receive a constant rate clock signal and an n bit parallel binary count output connected to the second n bit input of the magnitude comparator;

an AND gate having a first input coupled to receive the constant rate clock signal in frequency divided form and a second input coupled to receive a magnitude portion of the digital unary input signal, and further having an output connected to the clock input of the first counter; and wherein the comparator continually generates an output signal indicative of the relative magnitudes of the counts of the first and second counters, whereby said output signal is a PWM output signal with an average value representing a ramp voltage having a slope determined by the magnitude portion of the digital unary input signal with a direction of a slope of the output signal being determined by the polarity of the sign bit.

5. A digital pulse-width-modulation (PWM) generator as claimed in claim 4 wherein the n bit parallel binary count output of the first n bit digital up/down counter is connected to the first n bit input of the magnitude comparator with a least significant bit (LSB) of the output connected to a LSB of the first input of the comparator and thereafter in bit significance sequence, and the n bit parallel binary count output of the second n bit counter is connected to the second n bit input of the magnitude comparator with a LSB of the output connected to a LSB of the second input of the comparator and thereafter in bit significance sequence.

6. A digital pulse-width-modulation (PWM) generator as claimed in claim 4 wherein the n bit parallel binary count output of the second n bit digital up/down counter is connected to the second n bit input of the magnitude comparator with a most significant bit (MSB) of the output connected to a LSB of the second input of the comparator and thereafter in reverse bit significance sequence, and the n bit parallel binary count output of the first n bit counter is connected to the first n bit input of the magnitude comparator with a LSB of the output connected to a LSB of the first input of the comparator and thereafter in bit significance sequence.

7. A loudspeaker as claimed in claim 1 wherein said encoder comprises a circuit for converting a digital input signal comprised of n input digits into a plurality of unary signals comprising identical modular sub-encoders each capable of encoding $n/k=q$ input digits, and all connected to a common input signal and control bus and not otherwise to each other, and each programmable so as to each respond to and encode to unary, a certain unique range of input digital signals the range being selected with a magnitude comparator, so as to encode the entire n input digits of the input signal when all acting in concert.

8. A loudspeaker as claimed in claim 7 further comprising a programmable bus-control-structure in which modules can be individually controlled without the use of addresses for the modules comprising:

a bus controller situated at a first end of the bus;

a plurality of modules coupled to the bus, each module comprising a flip flop;

a control line daisy chain coupled through the plurality of flip flops in a sequential order so as to form a serial input shift register with the bus controller coupled at a serial data input of the serial input shift register;

first control means for generating a logic signal on said control line that can be successively clocked through said modules;

second control means coupled to said bus for controlling said modules via control signals transmitted over said bus; and wherein said modules are adapted to respond to said control signals only when the corresponding flip flop is storing said logic signal.

9. A loudspeaker as claimed in claim 1 wherein each transducer is bipolar, and therefore is able to produce both positive and negative acoustic pressure pulses dependent on a polarity of the unary signal applied.

10. A loudspeaker as claimed in claim 1, wherein the transducers are arranged in a two dimensional array.

11. A loudspeaker as claimed in claim 1, wherein the transducers are arranged in a three dimensional array with gaps between the transducers arranged to allow sound energy from all transducers to pass to the loudspeaker listening area.

12. A loudspeaker as claimed in claim 1, further comprising delay means corresponding to at least one of the transducers capable of independently delaying the signal to the corresponding transducer in order to optimize the relative time of arrival at the position of the listener of correlated signals from the transducers.

13. A loudspeaker as claimed in claim 1, wherein each transducer has a geometric center and is physically positioned relative to other of the transducers such that all the geometric centers of the transducers are as close to a single point in space as possible to minimize the apparent spatial distribution of sound generated by the loudspeaker.

14. A loudspeaker as claimed in claim 1, wherein each transducer is comprised of a multiplicity of transducers, each of said multiplicity of transducers having a geometric center and being physically positioned relative to other multiplicities of transducers such that all the geometric centers of the multiplicities of transducers are as close to a single point in space as possible to minimize the apparent spatial distribution of sound generated by the loudspeaker.

15. A loudspeaker as claimed in claim 1 wherein the transducers are connected to the unary digital signals in such an arrangement that spatially adjacent transducers produce the pressure pulses corresponding to a discrete-time-sampled unary digital signal so as to minimize any apparent motion of the sound source as sound level changes.

16. A loudspeaker as claimed in claim 1 further comprising an acoustic low pass filter placed between the transducers and the listening area so as to minimize unwanted acoustic output in the frequency range above the normal limits of human hearing due to the pulsed nature of the outputs of individual transducers.

17. A loudspeaker as claimed in claim 1 further comprising over-sampling and interpolating circuits to increase the effective sample rate of the loudspeaker-input-signal.

18. A loudspeaker as claimed in claim 1 further comprising an analog-to-digital converter to convert an analog loudspeaker-input-signal into a digital loudspeaker-input-signal.

19. A loudspeaker as claimed in claim 1 further comprising a driver associated with each transducer to convert the unary signals to appropriate current and voltage levels.

20. A loudspeaker as claimed in claim 19, wherein the power level controller gates the transducers on and off with a high frequency digital waveform in addition to any unary pulse-shaping modulation already present.

21. A loudspeaker as claimed in claim 20 in which the automatic-control-means continuously stores the maximum of the loudspeaker-input-signal and adjusts the power level controller responsive to the maximum magnitude so as to optimize the resolution of the loudspeaker within the limits produced by the number of transducers available subject to the total output amplitude corresponding as closely as possible to the required output amplitude.

22. A loudspeaker as claimed in claim 19 further comprising automatic-control-means coupled to the power level controller for raising and lowering the mean amplitude of the pressure pulse responsive to the magnitude of the loudspeaker input signal.

23. A loudspeaker as claimed in claim 1 further comprising a power level controller for adjusting a mean amplitude of the pressure pulses by gating the discrete-time-sampled unary digital signals on and off with a high frequency digital waveform whose mark-space ratio is continuously variable from 0 to 1 independent of any unary and pulse-shaping modulation already present.

24. A pulse shaper for the application of drive pulses to an inertia-dominated electroacoustic transducer comprising:

first and second D flip flops, each having a clock input, a reset input coupled to a periodic clock signal and a D input coupled to a first steady state signal level, and a Q output, wherein said Q outputs of said first and second D flip flops are differentially coupled to the transducer;

first and second exclusive-OR gates, each having (1) an output coupled to the clock input of said first and second D flip flops, respectively, (2) a first input coupled to a digital unary input magnitude signal, and (3) a second input coupled to a digital unary input sign signal, directly and through a level inverter, respectively;

whereby the Q output of the first and second flip flops to the transducer collectively is an impulse of width equal to one half a period of the clock signal commencing at the start of the digital unary input magnitude signal and whose polarity is controlled by the digital unary input sign signal, and a second impulse of equal width and opposite polarity at the end of the digital unary input magnitude signal.

* * * * *

UNITED STATES PATENT AND TRADEMARK OFFICE
CERTIFICATE OF CORRECTION

PATENT NO. : 6,373,955 B1 Page 1 of 1
DATED : April 16, 2002
INVENTOR(S) : Anthony Hooley It is certified that error appears in the above-identified patent and that said Letters Patent is hereby corrected as shown below:

<u>Title page,</u>
Item [73], Assignee should read as follows:

-- [73]  Assignee: 1...IPRLIMITED --.

Signed and Sealed this

Twentieth Day of August, 2002

*Attest:*

JAMES E. ROGAN
*Attesting Officer*  *Director of the United States Patent and Trademark Office*